(12) United States Patent
Tei et al.

(10) Patent No.: US 11,521,675 B1
(45) Date of Patent: Dec. 6, 2022

(54) BLOCK-DEPENDENT CELL SOURCE BOUNCE IMPACT REDUCTION IN NON-VOLATILE MEMORY

(71) Applicant: SANDISK TECHNOLOGIES LLC, Addison, TX (US)

(72) Inventors: Kou Tei, San Jose, CA (US); Anirudh Amarnath, San Jose, CA (US); Ohwon Kwon, Pleasanton, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 17/349,009

(22) Filed: Jun. 16, 2021

(51) Int. Cl.
*G11C 7/00* (2006.01)
*G11C 11/4096* (2006.01)
*G11C 5/06* (2006.01)
*G11C 11/4074* (2006.01)
*G11C 11/408* (2006.01)

(52) U.S. Cl.
CPC ............ *G11C 11/4096* (2013.01); *G11C 5/06* (2013.01); *G11C 11/4074* (2013.01); *G11C 11/4085* (2013.01)

(58) Field of Classification Search
CPC .............. G11C 11/4096; G11C 115/06; G11C 11/4074; G11C 11/4085
USPC .................................................. 365/189.011
See application file for complete search history.

(56) References Cited

U.S. PATENT DOCUMENTS

2018/0226108 A1 * 8/2018 Kwon .................... G11C 7/222

* cited by examiner

*Primary Examiner* — Huan Hoang
(74) *Attorney, Agent, or Firm* — Morgan, Lewis & Bockius LLP

(57) ABSTRACT

A data storage system includes a storage medium coupled to a storage controller via an electrical interface connected to a plurality of input/output (IO) pads of the storage medium. The storage medium receives a read or write instruction from the storage controller via the IO pads, associates the read or write instruction with memory cells of a first block of a first plane of a plurality of planes of the storage medium, and adjusts a word line voltage level or a source line voltage level for the first block of the first plane based on (i) a position of the first plane with respect to the IO pads of the storage medium and (ii) a position of the first block within the first plane.

20 Claims, 14 Drawing Sheets

SL Variation at Different Block Locations in
Plane Not Proximate to IO Pads in Peripheral Circuitry

| | Bounce | Gradient |
|---|---|---|
| Block A | 18.9 mV | 2.4 mV |
| Block B | 17.0 mV | 3.4 mV |
| Block C | 15.9 mV | 3.6 mV |

| | Bounce | Gradient |
|---|---|---|
| Block A | 19.2 mV | 3.6 mV |
| Block B | 17.0 mV | 3.5 mV |
| Block C | 15.9 mV | 3.6 mV |

BLOCK-DEPENDENT CELL SOURCE BOUNCE IMPACT REDUCTION IN NON-VOLATILE MEMORY

TECHNICAL FIELD

The present description relates in general to data storage systems and methods, and more particularly to, for example, block-dependent cell source bounce impact reduction.

BACKGROUND

Non-volatile memories, such as flash memory devices, have supported the increased portability of consumer electronics, and have been utilized in relatively low power enterprise storage systems suitable for cloud computing and mass storage. The ever-present demand for almost continual advancement in these areas is often accompanied by demand to improve data storage capacity. The demand for greater storage capacity in turn stokes demand for greater performance (e.g., quicker reads and writes), so that the addition of storage capacity does not slow down the memory device. As such, there is ongoing pressure to increase the capacity and the operating speed of non-volatile memories in order to further improve the useful attributes of such devices.

SUMMARY

One way to increase the capacity of non-volatile memories is to make storage devices more dense and implement peripheral circuitry underneath storage arrays. However, as storage devices increase in density, some voltage signals within the storage device may be affected by their proximity to components in the peripheral circuitry. For example, the source line voltage for blocks that are close to input/output (IO) pads of the peripheral circuitry may be subject to increased variation. This application describes various systems and methods of compensating for the increased variation in source line voltages in blocks that are proximate to IO pads of the peripheral circuitry.

In one aspect, a data storage system comprises a storage controller coupled to a storage medium via an electrical interface, wherein the electrical interface is connected to a plurality of input/output (IO) pads of the storage medium. The storage medium comprises a plurality of planes, wherein each of the plurality of planes includes a plurality of blocks of memory cells; control circuitry configured to receive a read or write instruction from the storage controller via the IO pads and associate the read or write instruction with memory cells of a first block of a first plane of the plurality of planes; and driver adjustment circuitry.

The driver adjustment circuitry is configured to adjust a word line voltage level via a word line driver or a source line voltage via a source line driver for the first block of the first plane based on (i) a position of the first plane with respect to the IO pads of the storage medium and (ii) a position of the first block within the first plane.

In some implementations, the driver adjustment circuitry is configured to adjust the word line voltage level for the first block of the first plane; and adjusting the word line voltage level for the first block of the first plane includes increasing the word line voltage level by a minimum step increment associated with the word line driver.

In some implementations, the driver adjustment circuitry is configured to adjust the source line voltage level for the first block of the first plane; and adjusting the source line voltage level for the first block of the first plane includes decreasing the word line voltage level by a minimum step increment associated with the source line driver.

In some implementations, the IO pads of the storage medium are located in peripheral circuitry disposed in a CMOS under array (CuA) arrangement; the first plane is located closer to the IO pads in the peripheral circuitry than a second plane; the first block of the first plane is located closer to the IO pads in the peripheral circuitry than a second block in the first plane; and the driver adjustment circuitry is further configured to forgo adjusting word line voltage levels associated with read and write operations or source line voltage levels associated with read and write operations for (i) the second block of the first plane and (ii) for all blocks of the second plane.

In some implementations, the first plane is a bottom plane; the second plane is a middle or top plane; the first block of the first plane is a bottom block; and the second block of the first plane is a middle or top block.

In some implementations, the driver adjustment circuitry is configured to cause the word line driver to adjust the word line voltage level by sending (i) an adjustment enable signal to the word line driver and (ii) an adjustment amount signal to the word line driver specifying an amount to increase the word line voltage level.

In some implementations, the driver adjustment circuitry is configured to cause the source line driver to adjust the source line voltage level by sending (i) an adjustment enable signal to the source line driver and (ii) an adjustment amount signal to the source line driver specifying an amount to decrease the source line voltage level.

Various implementations of systems and methods within the scope of the appended claims each have several aspects, no single one of which is solely responsible for the desirable attributes described herein. Without limiting the scope of the appended claims, some prominent features are described. After considering this discussion, and particularly after reading the section entitled "Detailed Description" one will understand how the features of various implementations are used to improve performance at the interface.

BRIEF DESCRIPTION OF THE DRAWINGS

So that the present disclosure can be understood in greater detail, a more particular description may be had by reference to the features of various implementations, some of which are illustrated in the appended drawings. The appended drawings, however, merely illustrate the more pertinent features of the present disclosure and are therefore not to be considered limiting, for the description may admit to other effective features.

Figure 1:
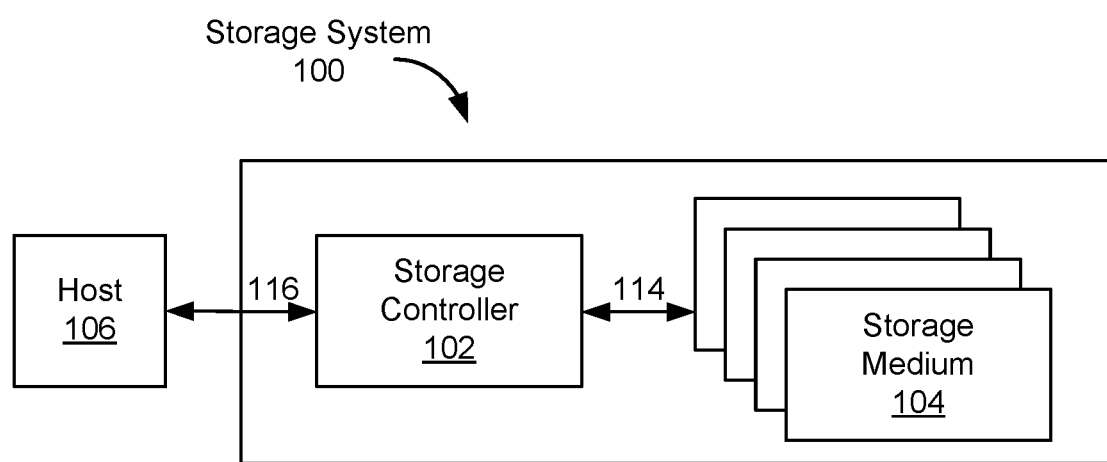
FIG. 1 is a functional block diagram of a non-volatile storage system in accordance with some implementations.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals are used to denote like features throughout the specification and figures.

DETAILED DESCRIPTION

FIG. 1 is a functional block diagram of a non-volatile storage system in accordance with some implementations. Storage system 100 includes a storage controller 102 (sometimes referred to as a flash memory controller) and non-volatile memory that may be made up of one or more storage mediums 104 (sometimes referred to as memory dies). As used herein, the term storage medium (or memory die) refers to a plurality of non-volatile memory cells (e.g., one or more memory arrays), and associated circuitry (e.g., peripheral circuitry) for managing the physical operation of the non-volatile memory cells. In some implementations, the memory cells and associated circuitry are formed on a single semiconductor substrate. Storage controller 102 interfaces with a host system 106 (also referred to as a host) and transmits command sequences for read, program, and erase operations to storage medium(s) 104. Throughout this disclosure, reference may be made to a single storage medium 104. However, it should be understood that such features may additionally or alternatively be implemented across a plurality of storage mediums 104.

The storage controller 102 manages data stored on one or more storage mediums 104 (e.g., flash memory) and communicates with a host 106, such as a computer or electronic device. The storage controller 102 can have various functionality in addition to the specific functionality described herein. For example, the storage controller 102 can format the storage medium 104 to ensure the memory is operating properly, map out bad memory cells, and allocate spare memory cells to be substituted for future failed memory cells. Some part of the spare memory cells can be used to hold firmware to operate the storage controller 102 and implement other features.

In operation, when the host 106 needs to read data from or write data to a storage medium 104, the host 106 communicates with the storage controller 102. If the host 106 provides a logical address to which data is to be read/written, the storage controller 102 may convert the logical address received from the host 106 to a physical address in the storage medium 104. Alternatively, the host 106 may provide the physical address. The storage controller 102 may also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The storage medium(s) 104 may include any suitable non-volatile storage medium, including NAND flash memory cells and/or NOR flash memory cells. The memory cells can take the form of solid-state (e.g., flash) memory cells and can be one-time programmable, few-time programmable, or multi-time programmable. The memory cells can also be single-level cells (SLC), multiple-level cells (MLC), triple-level cells (TLC), quad-level cells (QLC), or use other memory cell level technologies. Also, the memory cells can be fabricated in a two-dimensional or three-dimensional fashion.

The interface between the storage controller 102 and the storage medium(s) 104 may be any suitable flash interface, such as Toggle Mode or Open NAND Flash Interface (ONFI).

In some implementations, storage system 100 may be a card-based system, such as a secure digital (SD) or a micro secure digital (micro-SD) card. In some implementations, storage system 100 may be part of an embedded storage system. For example, the storage controller 102 and storage medium(s) 104 may be embedded within the host 106, such as in the form of a solid-state disk (SSD) drive installed in a computer. Such an SSD may emulate, replace, or be used instead of a hard disk drive inside the host 106, or be used as a NAS device, and so forth. In any case, such an SSD need not be made to work as a hard drive.

Although in the example illustrated in FIG. 1, storage system 100 includes a single channel between storage controller 102 and storage medium 104, the subject matter described herein is not limited to having a single memory channel. For example, in some storage system architectures, two, four, eight, or more channels may exist between the storage controller 102 and the storage medium(s) 104, depending on controller capabilities. In any of the implementations described herein, a plurality of channels may exist between the storage controller 102 and the storage medium(s) 104, even if a single channel is depicted in the drawings.

In some implementations, an intermediate storage controller (not shown) may interface the host 106 with the storage controllers 102 of a plurality of storage systems 100. The interface between the intermediate storage controller and the plurality of storage systems 100 may be a bus interface, such as a serial advanced technology attachment (SATA) or peripheral component interface express (PCIe) interface. The plurality of storage systems 100 may be implemented in a solid state drive (SSD), such as found in portable computing devices, such as laptop computers, tablet computers, or mobile devices.

In some implementations, a plurality of intermediate storage controllers (not shown) may respectively interface the host 106 with the storage controllers 102 of a plurality of storage systems 100. Such a system may be referred to as a hierarchical storage system. The host 106 may access memories within the storage systems 100 via a bus interface. In some implementations, the bus interface may be an NVMe or fiber channel over Ethernet (FCoE) interface. In some implementations, a hierarchical storage system may be a rack mountable mass storage system that is accessible by multiple host 106 computers, such as would be found in a data center or other location where mass storage is needed.

Figure 2:
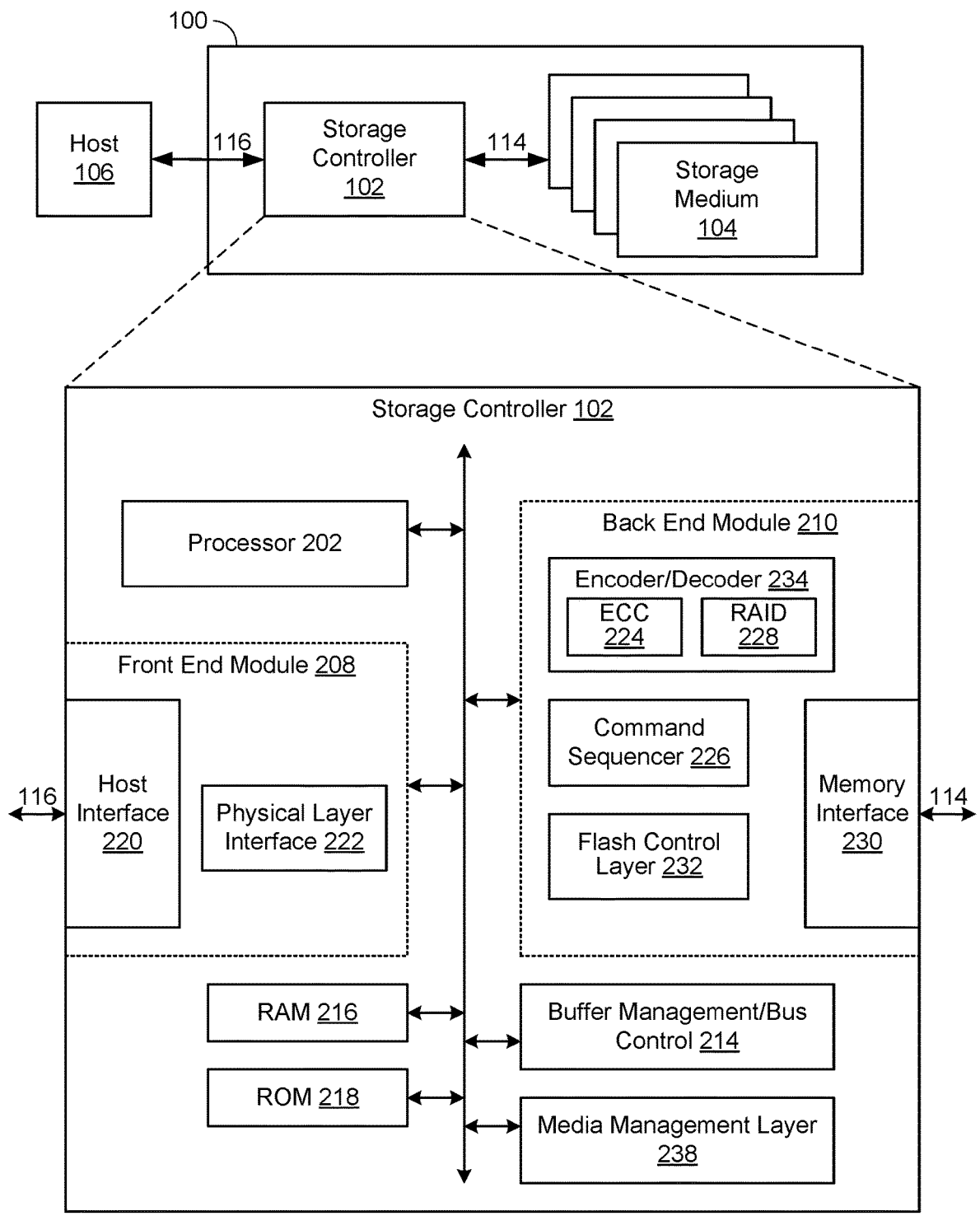
FIG. 2 is a functional block diagram of an example storage controller of the storage system depicted in FIG. 1 in accordance with some implementations.

FIG. 2 is a functional block diagram of an example storage controller 102 of the storage system 100 in accordance with some implementations. Storage controller 102 includes a front-end module 208 that interfaces with a host 106, a back-end module 210 that interfaces with one or more non-volatile storage mediums 104, and various other modules that perform functions described herein.

The storage controller 102 can take the form of processing circuitry, a microprocessor or processor, and a non-transitory computer-readable medium that stores computer-readable program code (e.g., firmware) executable by the (micro)processor, logic gates, switches, an application specific integrated circuit (ASIC), a programmable logic controller, and/or an embedded microcontroller, for example. Storage controller 102 can be configured with hardware and/or firmware to perform the various functions described herein. Also, some of the components shown as being internal to the storage controller 102 (e.g., RAM 216 and ROM 218) can also be stored external to the storage controller 102, and other components can be used. Additionally, the phrase "operatively in communication with" could mean directly in communication with or indirectly (wired or wireless) in communication with through one or more components, which may or may not be shown or described herein.

The components of storage controller 102 depicted in FIG. 2 may take the form of a packaged functional hardware unit (e.g., an electrical circuit) designed for use with other components, a portion of a program code (e.g., software or firmware) executable by a (micro)processor or processing circuitry (or one or more processors) that usually performs a particular function or related functions, or a self-contained hardware or software component that interfaces with a larger system. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively, or in addition, each module may include or comprise software stored in a processor readable device (e.g., memory) to program one or more processors for storage controller 102 to perform the functions described herein.

The storage controller 102 may include a buffer manager/bus controller 214, configured to manage buffers in random access memory (RAM) 216 and control the internal bus arbitration of the storage controller 102. A read only memory (ROM) 218 may store system boot code. Although illustrated in FIG. 2 as located within the storage controller 102, in some implementations one or both of the RAM 216 and ROM 218 may be located separately from the storage controller 102. In yet other implementations, portions of RAM 216 and ROM 218 may be located both within the storage controller 102 and outside the storage controller 102. Further, in some implementations, the storage controller 102, RAM 216, and ROM 218 may be located on separate semiconductor dies.

The storage controller 102 may include one or more processors 202 configured to control the overall operation of the storage controller 102. The processor 202 may issue commands to control circuitry 310 (FIG. 3) of storage medium 104, or to any other component of storage medium 104, via memory interface 230. In some implementations, the ROM 218 and/or RAM 216 may comprise code such as a set of instructions, and the processor 202 may be operable to execute the set of instructions to provide the functionality described herein. Additionally or alternatively, the processor 202 may access code from a portion of the memory array 350 (FIG. 3) in the storage medium 104, such as a reserved area of memory cells connected to one or more word lines.

The front-end module 208 includes a host interface 220 that provides a communication interface with the host 106. The choice of the type of host interface 220 can depend on the type of memory being used. Examples of host interfaces include, but are not limited to, SATA, SATA Express, SAS, Fibre Channel, USB, PCIe, and NVMe. The host interface 220 is a communication interface that facilitates transfer for data, control signals, and timing signals. The host interface 220 may include electrical interface circuitry that provides a physical connection to the channel(s) 116 connecting the storage controller 102 to the host. This electrical interface circuitry may be part of the host interface 220, or may be separately described as a physical layer interface 222.

In some implementations, the host interface 220, in communication with ROM 218, RAM 216, and/or processor 202, may be an electrical circuit that provides an electrical interface between the storage controller 102 and the host 106. For example, the host interface 220 may change the format or timing of signals, provide a buffer, isolate from surges, latch I/O, and so forth. Commands and data from the host 106 are received by the storage controller 102 via the host interface 220. Data sent to the host 106 is transmitted via the host interface 220.

The back-end module 210 includes a memory interface 230 that provides command sequences and data (to be written) to storage medium(s) 104 and receives status information and data (that was read) from storage medium(s) 104. In some implementations, the memory interface 230 may be a double data rate (DDR) interface such as Toggle Mode or ONFI.

In some implementations, the memory interface 230, in communication with ROM 218, RAM 216, and/or processor 202, may be an electrical circuit that provides an electrical interface between the storage controller 102 and the storage medium 104. For example, the memory interface 230 may change the format or timing of signals, provide a buffer, isolate from surges, latch I/O, and so forth.

The back-end module 210 may include an error correction controller (ECC) engine 224 and/or a Redundant Array of Independent Dies (RAID) module 228. The ECC engine 224 may be configured to encode data received from the host 106, and decode and error correct data read from the storage medium 104. The RAID module 228 may be configured to manage generation of RAID parity and recovery of failed data. The RAID parity may be used as an additional level of integrity protection for the data being written into the storage medium 104. In some implementations, the RAID module 228 may be a part of the ECC engine 224. The RAID parity may be added as an extra die or dies as implied by the common name, but it may also be added within the existing die, e.g., as an extra plane, or extra block, or extra WLs within a block. ECC engine 224 and RAID module 228 may both calculate redundant data that can be used to recover when errors occur and may be considered examples of redundancy encoders. Together, ECC engine 224 and RAID module 228 may be considered to form a combined redundancy encoder/decoder 234.

The back-end module 210 may include a command sequencer 226, and/or a flash control layer 232. The command sequencer 226 may generate command sequences, such as program and erase command sequences, for transmission to storage medium 104. The flash control layer 232 may control the overall operation of the back-end module 210.

The storage controller 102 may include a media management layer 238, which performs wear leveling of memory cells of storage medium 104. The storage controller 102 may also include other discrete components (not shown), such as external electrical interfaces, external RAM, resistors, capacitors, or other components that may interface with storage controller 102. In some implementations, one or more of the physical layer interface 222, RAID module 228, media management layer 238 and buffer management/bus controller 214 are optional components that are not necessary in the storage controller 102.

The Flash Translation Layer (FTL) or Media Management Layer (MML) 238 may be integrated as part of the flash management that may handle flash errors and interfacing with the host 106. In particular, the MML 238 may be a module in flash management and may be responsible for the internals of NAND management. In particular, the MML 238 may include an algorithm in the storage device firmware which translates writes from the host 106 into writes to the storage medium 104. The MML 238 may be needed because: 1) storage medium 104 may have limited endurance; 2) storage medium 104 may only be written in multiples of pages; and/or 3) a selected portion of memory cells of the storage medium 104 may not be written unless it is erased as a block (i.e. a block may be considered to be a minimum unit of erase and such a non-volatile memory may be considered a block-erasable non-volatile memory). The MML 238 may address these potential limitations of the storage medium 104 which may not be visible to the host 106. Accordingly, the MML 238 may translate write operations received from the host 106 into write operations for transmission to the storage medium 104.

Figure 3:
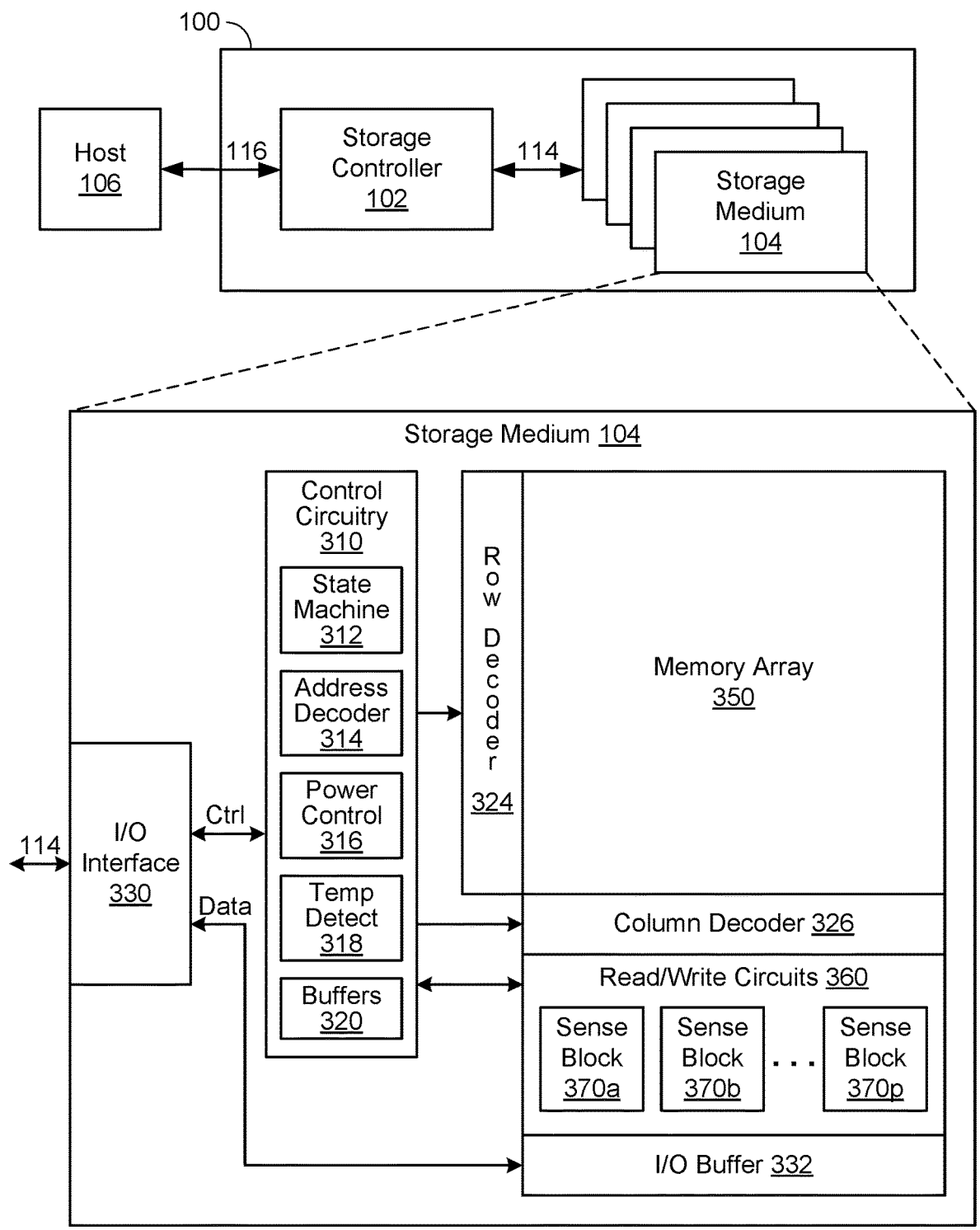
FIG. 3 is a functional block diagram of an example storage medium of the storage system depicted in FIG. 1 in accordance with some implementations.

FIG. 3 is a functional block diagram of an example storage medium 104 of the storage system 100 in accordance with some implementations. Storage medium 104 includes a memory array 350 including a plurality of memory cells, control circuitry 310, read/write circuits 360, and an input/output (I/O) interface 330.

In some implementations, a storage controller 102 (as described above with reference to FIG. 2) may included in the same storage device (e.g., a removable storage card) as the storage medium(s) 104. However, in other implementations, the storage controller 102 may be separated from the storage medium(s) 104. In some implementations, the storage controller 102 may be disposed on a different die than the storage medium 104. In some implementations, one storage controller 102 may communicate with a plurality of storage mediums 104. In some implementations, each storage medium 104 may have its own storage controller 102.

Commands and data may be transferred between the host 106 and the storage controller 102 via a data bus 116, and between the storage controller 102 and storage medium(s) 104 via an interface channel 114. In some implementations, the I/O interface 330 includes a set of I/O pins (also referred to as pads) that connect to respective communication lines of the interface channel 114. The I/O interface 330 may be connected to the control circuitry 310, row decoder 324, column decoder 326, read/write circuits 360, and/or memory array 350.

The I/O interface 330 may be a synchronous interface or an asynchronous interface. Examples of an I/O interface include a Toggle Mode Interface and an Open NAND Flash Interface (ONFI). Other I/O interfaces can also be used. Toggle mode (e.g., Toggle Mode 2.0 JEDEC Standard or Toggle Mode 900) is an asynchronous memory interface that supports SDR and DDR with a DQS signal acting as a data strobe signal.

Data received at the I/O interface 330 for writing to the memory array 350 (in accordance with a write command) is latched in an I/O buffer 332 before being written to the memory array 350. Similarly, data that is read from the memory array 350 (in accordance with a read command) is latched in the I/O buffer 332 before being transmitted to the storage controller 102 via the I/O interface 330. The I/O buffer 332 may be included in the I/O interface 330 or otherwise communicatively coupled to the I/O interface 330. The I/O buffer 332 includes a plurality of data latches. In some implementations, the data latches are arranged in groups of 8 (XDL0 through XDL7) or 16 (XDL0 through XDL15), depending on how many bits the I/O interface 330 is configured to receive or transmit at a time.

The read/write circuits 360 include multiple sense blocks 370 including 370a through 370p (sensing circuitry) and allow a page (or multiple pages) of data in multiple memory cells of the memory array 350 to be read or programmed (written) in parallel. In some implementations, each sense block 370 includes one or more sense amplifiers connected to respective bit lines of the memory array 350. The sense amplifiers sense voltage signals associated with selected memory cells (e.g., determining whether a given memory cell is conducting current during a sense operation, or how much current the given memory cell conducts during the sense operation). The sense amplifiers then amplify the sensed voltages to levels that are optimized for the I/O circuitry of the storage medium 104, interface channel 114, and storage controller 102.

Each bit line of the memory array 350 is coupled to a sense block 370, each of which includes one or more sense amplifiers. The sense amplifiers sense voltages on each bit line in accordance with read operations. The sense amplifiers sense the low power signals from respective bit lines that represents data bits (1 or 0) stored in respective memory cells. The sense amplifiers amplify small voltage swings to recognizable logic levels so the data can be interpreted properly by logic outside the memory array (e.g., storage controller 102). After a sense amplifier for a particular bit line amplifies the sensed voltage to a normal logic level, the bit from the desired cell is then latched from the cell's sense amplifier into a data latch in the I/O buffer 332, and transferred to the storage controller 102 on data lines DQ of the output bus 114.

The sense amplifiers sense data read onto corresponding bit lines from a plurality of memory cells associated with the corresponding bit lines. The sense amplifiers may include bit line drivers for applying a voltage to corresponding bit lines in accordance with write data. The sense amplifier for a given bit line or group of bit lines may directly control the bit line(s). In data reading, the read/write circuits 360 may apply a strobe signal to a given sense amplifier. The sense amplifier determines data at the assertion timing of the strobe signal (e.g., an ON state of a memory cell may be defined as data "0", and an off state may be defined as data "1"). This data may be held in an internal latch SADL of the sense amplifier before being transferred to one of the data latches of the I/O buffer 332.

Input and output of data to and from the sense amplifiers are performed via the data latches of the I/O buffer 332. That is, data received from the storage controller 102 is transferred to sense amplifiers via the data latches. In addition, data in the sense amplifiers (in internal latches of the sense amplifiers) is transmitted to the storage controller 102 via the data latches. The data latches of the I/O buffer 332 may function as the cache memory of the storage medium 104.

The control circuitry 310 cooperates with the read/write circuits 360 to perform memory operations (e.g., write, read, erase, and others) on the memory array 350. In some implementations, control circuitry 310 includes a state machine 312, an on-chip address decoder 314, a power control circuit 316, a temperature detection circuit 318, and/or buffers 320.

The state machine 312 provides die-level control of memory operations. In some implementations, the state machine 312 is programmable by software. In other implementations, the state machine 312 does not use software and is completely implemented in hardware (e.g., electrical circuits). In some implementations, the state machine 312 can be replaced by a microcontroller or microprocessor.

The address decoder 314 provides an address interface between addresses used by the host 106 or storage controller 102 to the hardware address used by the decoders 324 and 326.

The power control module 316 controls the power and voltages supplied to the word lines and bit lines during memory operations. It can include drivers for word line layers (discussed below) in a 3D configuration, select transistors (e.g., SGS and SGD transistors, described below) and source lines. Power control module 316 may include charge pumps for creating voltages.

The temperature detection circuit 318 may be configured to detect temperature in or around the storage medium 104. The temperature detection circuit 318 may include an on-chip temperature sensor.

The buffers 320 may be registers, ROM fuses, and/or other storage devices for storing default values such as base voltages and other parameters.

Any one or any combination of control circuitry 310, state machine 312, decoders 314/324/326, temperature detection circuit 318, power control module 316, sense blocks 370, read/write circuits 360, and storage controller 102 can be considered one or more control circuits (or managing circuitry, or peripheral circuitry) that performs the functions described herein.

The memory array 350 may be addressable by word lines via a row decoder 324 and by bit lines via a column decoder 326. The memory array 350 may comprise one or more 2D or 3D arrays of memory cells. The memory array 350 may comprise a monolithic 3D memory array in which multiple memory levels are formed above (and not in) a single substrate, such as a wafer, with no intervening substrates. The memory array 350 may comprise any type of non-volatile memory that is monolithically formed in one or more physical levels of arrays of memory cells having an active area disposed above a silicon substrate. The memory array 350 may be in a non-volatile memory device having circuitry associated with the operation of the memory cells, whether the associated circuitry is above or within the substrate.

Multiple memory elements in memory array 350 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors. In some implementations, the non-volatile memory cells of memory array 350 comprise vertical NAND strings with charge-trapping material. In such a configuration, a NAND string includes memory cells connected by a channel.

A NAND flash memory array 350 may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three-dimensional memory array 350 may be arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three-dimensional memory array 350 may be vertically arranged as a stack of multiple two-dimensional memory device levels. As another non-limiting example, a three-dimensional memory array 350 may be arranged as multiple vertical columns (e.g., columns extending substantially perpendicular to the major surface of the substrate, i.e., in the y direction) with each column having multiple memory cells. The vertical columns may be arranged in a two-dimensional configuration, e.g., in an x-y plane, resulting in a three-dimensional arrangement of memory cells, with memory cells on multiple vertically stacked memory planes. Other configurations of memory elements in three dimensions can also constitute a three-dimensional memory array.

By way of a non-limiting example, in a three-dimensional NAND memory array, the memory elements may be coupled together to form vertical NAND strings that traverse across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

In some implementations, the memory array 350 comprises a two dimensional memory array of non-volatile memory cells. In one example, the non-volatile memory cells are NAND flash memory cells utilize floating gates. Other types of memory cells (e.g., NOR-type flash memory) can also be used.

The exact type of memory array architecture or memory cells included in the memory array 350 is not limited to the examples above. Many different types of memory array architectures or memory cell technologies can be used to form the memory array 350. No particular non-volatile memory technology is required for purposes of the implementations described herein. Other examples of suitable technologies for memory cells of the memory array 350 include ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of the memory array 350 include two dimensional arrays, three dimensional arrays, cross-point arrays, stacked two dimensional arrays, vertical bit line arrays, and the like.

A person of ordinary skill in the art will recognize that the technology described herein is not limited to a single specific memory array, but covers many relevant memory arrays within the spirit and scope of the technology as described herein and as understood by one of ordinary skill in the art.

Figure 4A:
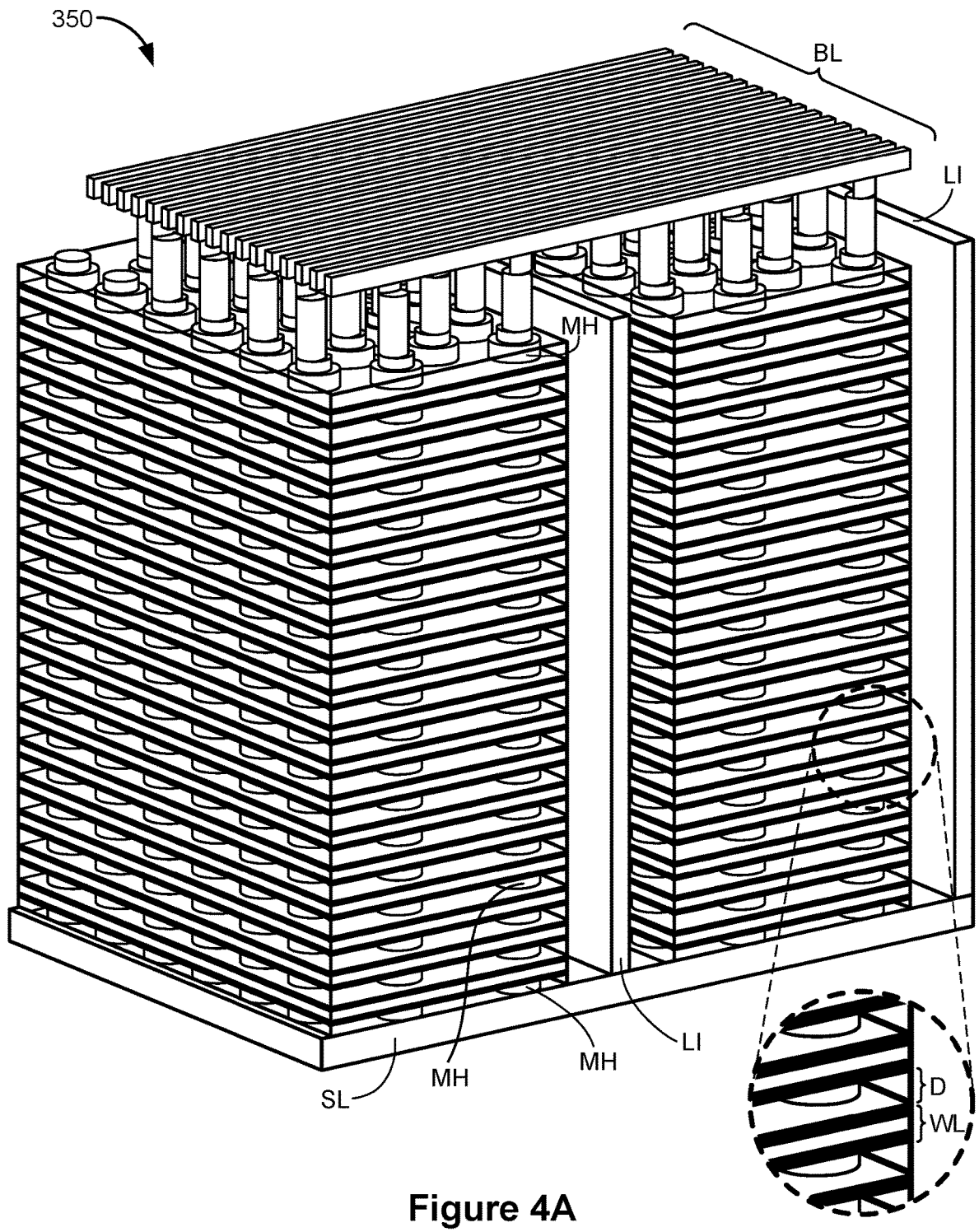
FIG. 4A is a perspective view of a portion of one implementation of a three-dimensional monolithic memory array in accordance with some implementations.

FIG. 4A is a perspective view of a portion of an example implementation of a monolithic three dimensional memory array that may comprise memory array 350, which includes a plurality of non-volatile memory cells. For example, FIG. 4A shows a portion of one block of memory. The structure depicted includes a set of bit lines BL positioned above a stack of alternating dielectric layers and conductive layers with vertical columns of materials extending through the dielectric layers and conductive layers. For example purposes, one of the dielectric layers is marked as D and one of the conductive layers (also called word line layers) is marked as WL.

The number of alternating dielectric layers and conductive layers can vary based on specific implementation requirements. One set of implementations includes between 104-216 alternating dielectric layers and conductive layers. One example implementations includes 96 data word line layers, 8 select layers, 6 dummy word line layers and 110 dielectric layers. More or less than 104-216 layers can also be used. As will be explained below, the alternating dielectric layers and conductive layers may be divided into four "fingers" or sub-blocks by local interconnects LI. FIG. 4A shows two fingers and two local interconnects LI. Below the alternating dielectric layers and word line layers is a source line layer SL. Vertical columns of materials (also known as memory holes) are formed in the stack of alternating dielectric layers and conductive layers. For example, one of the vertical columns/memory holes is marked as MH. Note that in FIG. 4A, the dielectric layers are depicted as see-through so that the reader can see the memory holes positioned in the stack of alternating dielectric layers and conductive layers. In some implementations, NAND strings are formed by filling the vertical column/memory hole with materials including a charge-trapping material to create a vertical column of memory cells. Each memory cell can store one or more bits of data. More details of the three dimensional monolithic memory array that comprises memory array 350 is provided below with reference to FIG. 4B-4F.

Figure 4B:
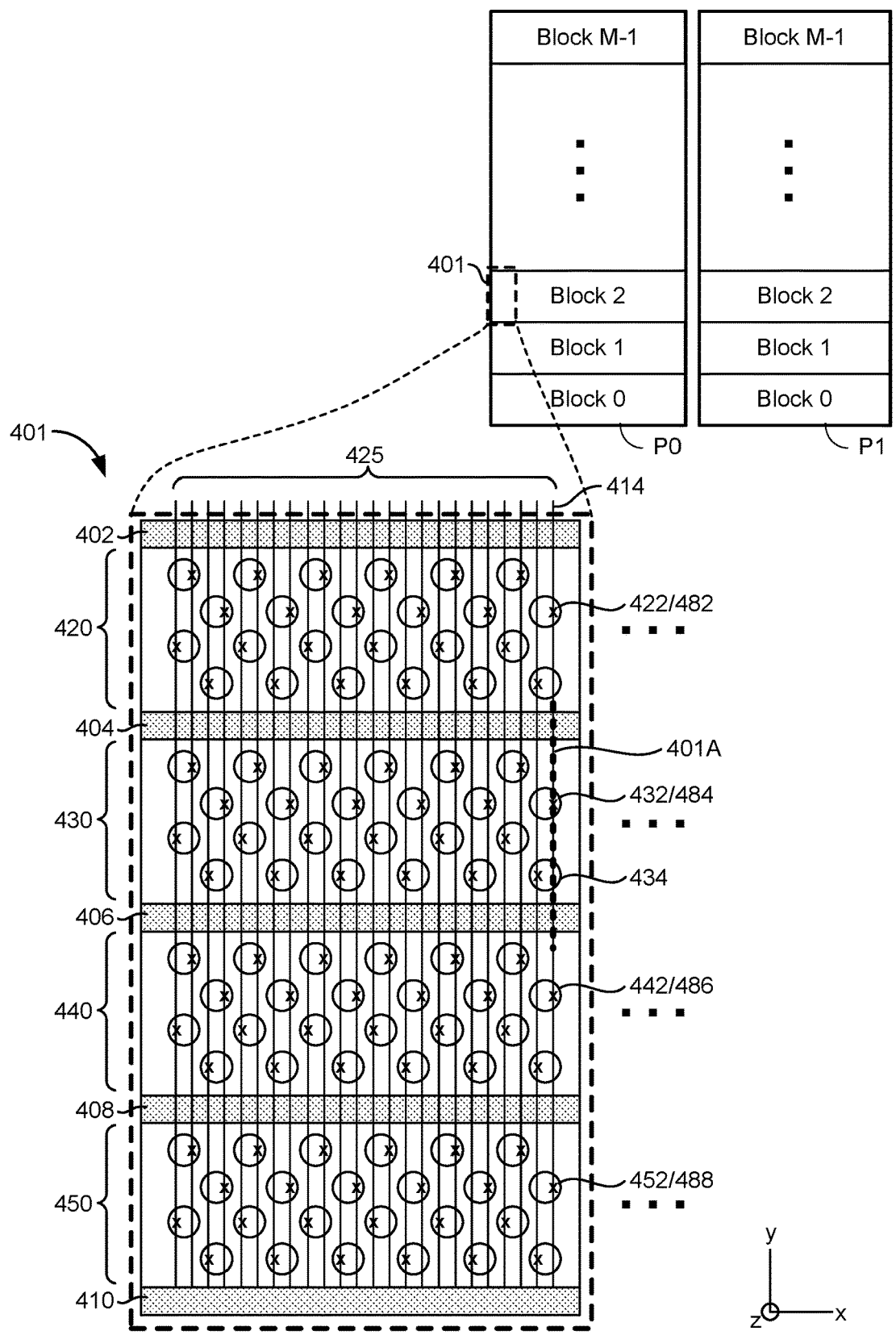
FIG. 4B is a block diagram of a memory array having two planes, and a top view of a portion of a block of memory cells in accordance with some implementations.

FIG. 4B depicts an example three dimensional (3D) NAND structure that corresponds to the structure of FIG. 4A and can be used to implement memory array 350 of FIG. 3. The memory array 350 may be divided into two planes P0 and P1. Each plane may be divided into M blocks. In one example, each plane has about 2000 blocks. However, different numbers of blocks and planes can also be used. In some implementations, a block of memory cells is a unit of erase. That is, all memory cells of a block are erased together.

In some implementations, memory cells can be grouped into blocks for other reasons, such as to organize the memory array 350 to enable the signaling and selection circuits. In some implementations, a block represents a groups of connected memory cells as the memory cells of a block share a common set of unbroken word lines and unbroken bit lines. Block 0 and block M−1 of both planes P0 and P1 may be referred to as being located in an edge region/section of the memory array 350.

FIG. 4B further includes a detailed top view of a portion 401 of one block from the memory array 350. The block depicted in portion 401 extends in the x direction. In some implementations, the memory array 350 has many layers; however, FIG. 4B only shows the top layer.

FIG. 4B depicts a plurality of circles that represent the vertical columns MH. Each of the vertical columns include multiple select transistors (also referred to as a select gate or selection gate) and multiple memory cells. In some implementations, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the x direction, the block includes more vertical columns than depicted in FIG. 4B.

FIG. 4B also depicts a set of bit lines 425, including bit line 414. FIG. 4B shows twenty four bit lines because only a portion of the block is depicted. More than twenty four bit lines may be connected to vertical columns of the block. Each of the circles representing vertical columns has an "x" to indicate its connection to one bit line. For example, bit line 414 is connected to vertical columns 422, 432, 442 and 452 (but not vertical column 434). In some implementations, bit lines are positioned over the memory array 350 and run along the entire length of the plane (e.g., from the top of plane P0 to the bottom of plane P0).

The block depicted in FIG. 4B includes a set of local interconnects 402, 404, 406, 408, and 410 that connect the various layers to a source line below the vertical columns. Local interconnects 402, 404, 406, 408, and 410 also serve to divide each layer of the block into four regions. For example, the top layer depicted in FIG. 4B is divided into regions 420, 430, 440, and 450, which are referred to as fingers or sub-blocks. In the layers of the block that implement memory cells, the four regions are referred to as word line fingers that are separated by the local interconnects.

In some implementations, the word line fingers on a common level of a block connect together to form a single word line. In some implementations, the word line fingers on the same level are not connected together. In one example implementation, a bit line only connects to one vertical column in each of regions 420, 430, 440 and 450. For such an implementation, each block has sixteen rows of active columns and each bit line connects to four rows in each block. In some implementations, all of four rows connected to a common bit line are connected to the same word line (via different word line fingers on the same level that are connected together). Therefore, the address decoders use the source side selection lines and the drain side selection lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other implementations may include more or less regions per block, more or less rows of vertical columns per region and more or less rows of vertical columns per block. FIG. 4B also shows the vertical columns being staggered. In other implementations, different patterns of staggering can be used. In some implementations, the vertical columns are not staggered.

Figure 4C:
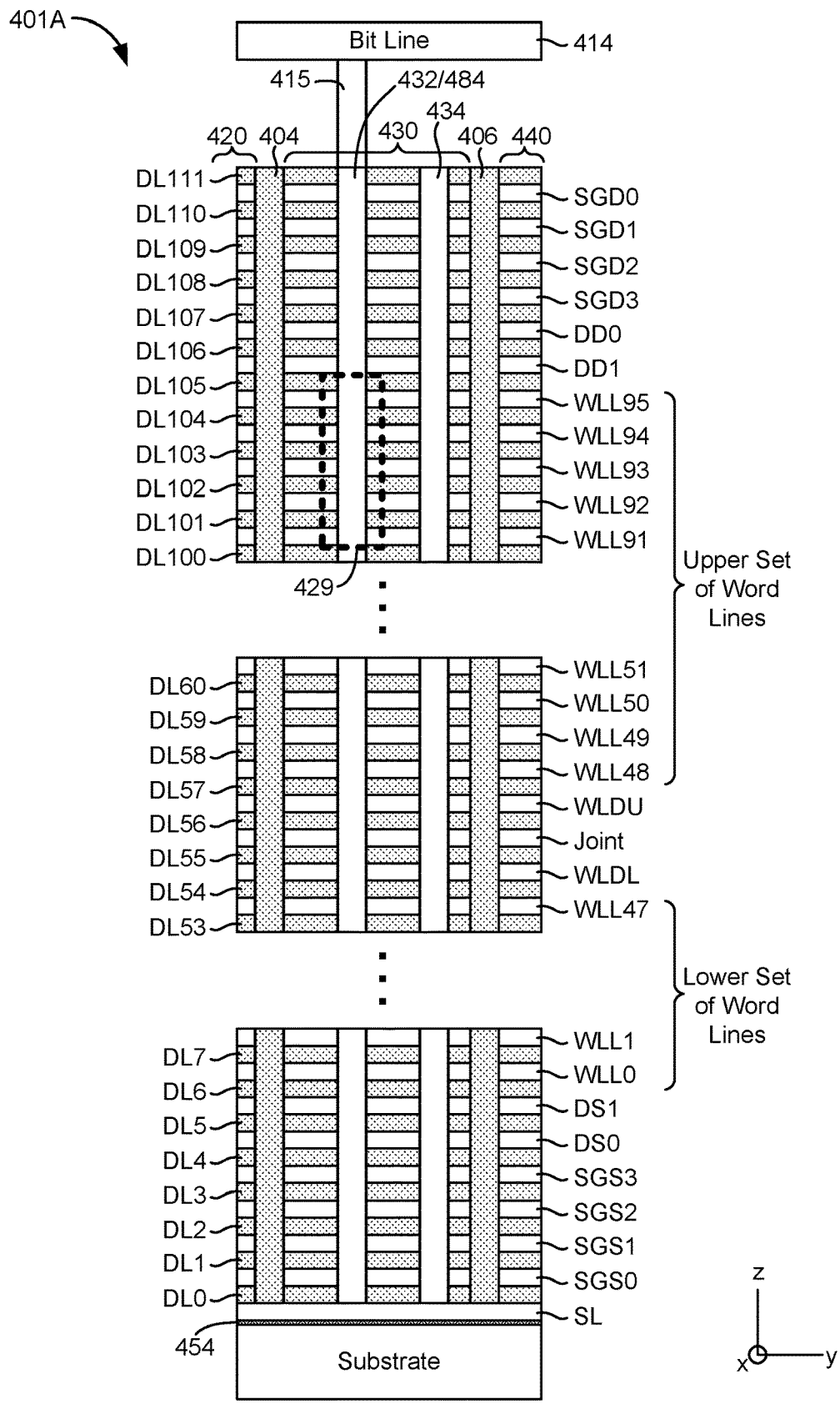
FIG. 4C depicts a cross sectional view of a portion of a block of memory cells in accordance with some implementations.

FIG. 4C depicts a portion of some implementations of the three dimensional memory array 350 showing a cross-sectional view along line 401A of FIG. 4B. This cross sectional view cuts through vertical columns 432 and 434 and region 430 (see FIG. 4B). The structure of FIG. 4C includes four drain side select layers SGD0, SGD1, SGD2 and SGD3; four source side select layers SGS0, SGS1, SGS2 and SGS3; six dummy word line layers DD0, DD1, DS0, DS1, WLDL, WLDU; and ninety-six data word line layers WLL0-WLL95 for connecting to data memory cells. Other implementations can implement more or less than four drain side select layers, more or less than four source side select layers, more or less than six dummy word line layers, and more or less than ninety six word lines.

Vertical columns 432 and 434 are depicted protruding through the drain side select layers, source side select layers, dummy word line layers and word line layers. In some implementations, each vertical column comprises a vertical NAND string. For example, vertical column 432 comprises NAND string 484. Below the vertical columns and the layers listed below is the substrate, an insulating film 454 on the substrate, and the source line SL. The NAND string of vertical column 432 has a source end at a bottom of the stack and a drain end at a top of the stack. As in agreement with FIG. 4B, FIG. 4C shows vertical column 432 connected to bit line 414 via connector 415. Local interconnects 404 and 406 are also depicted.

For ease of reference, drain side select layers SGD0, SGD1, SGD2 and SGD3; source side select layers SGS0, SGS1, SGS2 and SGS3; dummy word line layers DD0, DD1, DS0, DS1, WLDL and WLDU; and word line layers WLL0-WLL95 collectively are referred to as the conductive layers. In some implementations, the conductive layers are made from a combination of TiN and Tungsten. In other implementations, other materials can be used to form the conductive layers, such as doped polysilicon, metal such as Tungsten or metal silicide. In some implementations, different conductive layers can be formed from different materials. Between conductive layers are dielectric layers DL0-DL111. For example, dielectric layer DL104 is above word line layer WLL94 and below word line layer WLL95. In some implementations, the dielectric layers are made from SiO2. In other implementations, other dielectric materials can be used to form the dielectric layers.

The non-volatile memory cells are formed along vertical columns which extend through alternating conductive and dielectric layers in the stack. In some implementations, the memory cells are arranged in NAND strings. The word line layers WLL0-WLL95 connect to memory cells (also called data memory cells). Dummy word line layers DD0, DD1, DS0, DS1, WLDL and WLDU connect to dummy memory cells. A dummy memory cell does not store and is not eligible to store host data (data provided from the host 106, such as data from a user of the host 106), while a data memory cell is eligible to store host data. In some imple- mentations, data memory cells and dummy memory cells may have the same structure. A dummy word line is connected to dummy memory cells. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

FIG. 4C also shows a Joint area. In some implementations it is expensive and/or challenging to etch ninety six word line layers intermixed with dielectric layers. To ease this burden, some implementations include laying down a first stack of forty eight word line layers alternating with dielectric layers, laying down the Joint area, and laying down a second stack of forty eight word line layers alternating with dielectric layers. The Joint area is positioned between the first stack and the second stack. The Joint area is used to connect the first stack to the second stack. In FIG. 4C, the first stack is labeled as the "Lower Set of Word Lines" and the second stack is labeled as the "Upper Set of Word Lines." In some implementations, the Joint area is made from the same materials as the word line layers. In one example set of implementations, the plurality of word lines (control lines) comprises a first stack of alternating word line layers and dielectric layers, a second stack of alternating word line layers and dielectric layers, and a joint area between the first stack and the second stack, as depicted in FIG. 4C.

Figure 4D:
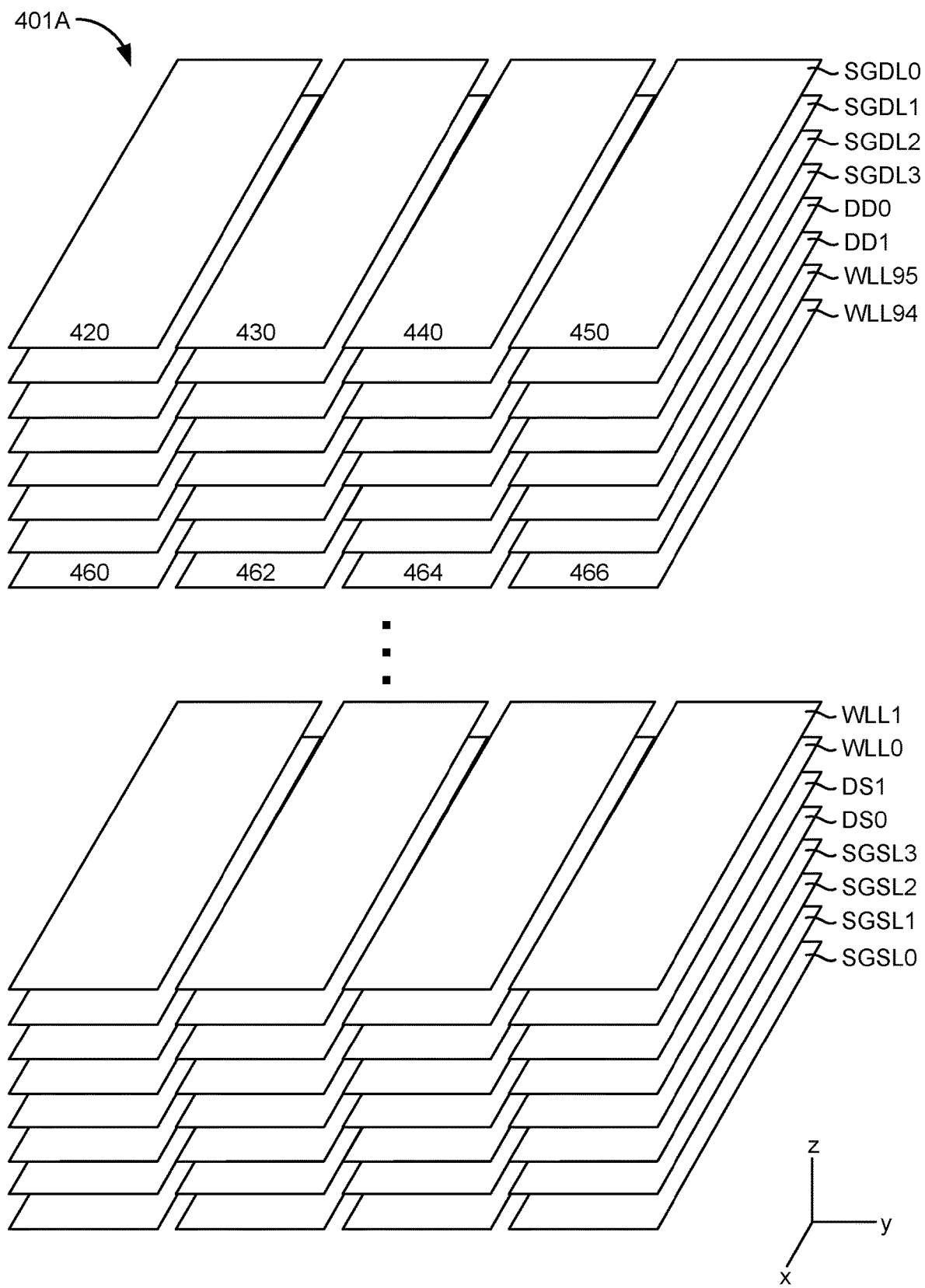
FIG. 4D depicts a view of the select gate layers and word line layers in accordance with some implementations.

FIG. 4D depicts a logical representation of the conductive layers (SGD0, SGD1, SGD2, SGD3, SGS0, SGS1, SGS2, SGS3, DD0, DD1, DS0, DS1, and WLL0-WLL95) for the block that is partially depicted in FIG. 4C. As mentioned above with reference to FIG. 4B, in some implementations local interconnects 402, 404, 406, 408, and 410 break up the conductive layers into four regions/fingers (or sub-blocks). For example, word line layer WLL94 is divided into regions 460, 462, 464, and 466. For the word line layers (WLL0-WLL95), the regions are referred to as word line fingers. For example, word line layer WLL94 is divided into word line fingers 460, 462, 464, and 466. For example, region 460 is one word line finger on one word line layer. In some implementations, each word line finger on the same level is connected together. In some implementations, each word line finger operates as a separate word line.

Drain side select gate layer SGD0 (the top layer) is also divided into regions 420, 430, 440, and 450, also known as fingers or select line fingers. In some implementations, each select line finger on the same level is connected together. In some implementations, each select line finger operates as a separate word line.

Figure 4E:
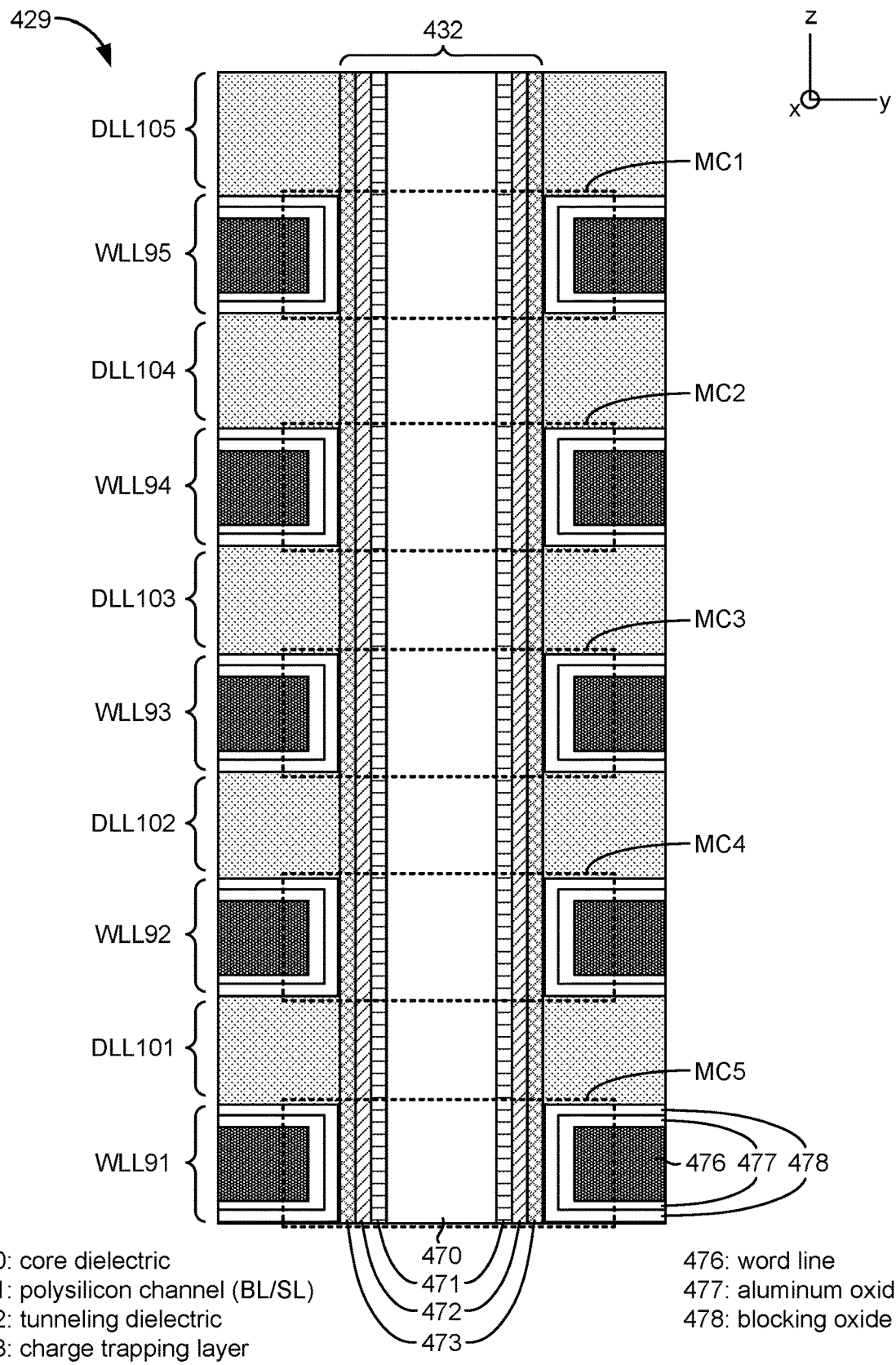
FIG. 4E is a cross sectional view of a vertical column of memory cells in accordance with some implementations.

FIG. 4E depicts a cross sectional view of region 429 of FIG. 4C that includes a portion of vertical column 432 (a memory hole) that extends through the alternating conductive layers and dielectric layers. In some implementations, the vertical columns are round; however, in other implementations other shapes can be used. In some implementations, vertical column 432 includes an inner core layer 470 that is made of a dielectric, such as SiO2. Other materials can also be used. Surrounding inner core 470 is polysilicon channel 471. Materials other than polysilicon can also be used. Note that it is the channel 471 that connects to the bit line and the source line. Surrounding channel 471 is a tunneling dielectric 472. In some implementations, tunneling dielectric 472 has an ONO structure. Surrounding tunneling dielectric 472 is charge trapping layer 473, such as (for example) silicon nitride. Other memory materials and structures can also be used. The technology described herein is not limited to any particular material or structure.

FIG. 4E depicts dielectric layers DLL105, DLL104, DLL103, DLL102, and DLL101, as well as word line layers WLL95, WLL94, WLL93, WLL92, and WLL91. Each of the word line layers includes a word line region 476 surrounded by an aluminum oxide layer 477, which is surrounded by a blocking oxide (e.g., SiO2) layer 478. The physical interaction of the word line layers with the vertical column forms the memory cells. Thus, a memory cell, in some implementations, comprises channel 471, tunneling dielectric 472, charge trapping layer 473, blocking oxide layer 478, aluminum oxide layer 477 and word line region 476.

For example, word line layer WLL95 and a portion of vertical column 432 comprise a memory cell MC1. Word line layer WLL94 and a portion of vertical column 432 comprise a memory cell MC2. Word line layer WLL93 and a portion of vertical column 432 comprise a memory cell MC3. Word line layer WLL92 and a portion of vertical column 432 comprise a memory cell MC4. Word line layer WLL91 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In some implementations, the programming is achieved through Fowler-Nordheim (FN) tunneling of the electrons into the charge trapping layer. During an erase operation, the electrons return to the channel or holes are injected into the charge trapping layer to recombine with electrons. In some implementations, erasing is achieved using hole injection into the charge trapping layer via a physical mechanism such as gate induced drain leakage (GIDL).

Figure 4F:
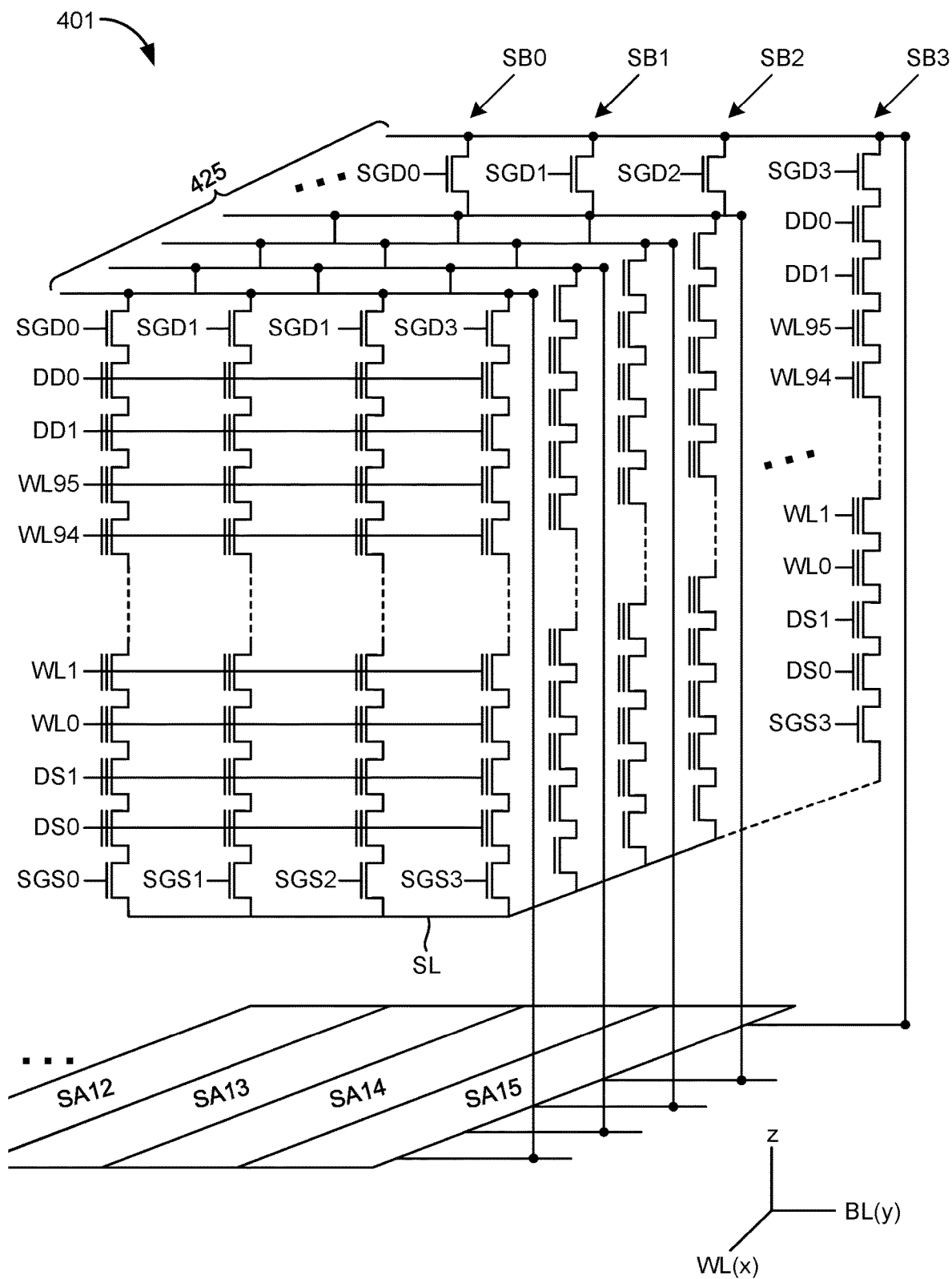
FIG. 4F is a schematic of a plurality of NAND strings in accordance with some implementations.

FIG. 4F is a schematic diagram of a portion of the memory array 350 depicted in FIGS. 4A-4E. FIG. 4A shows physical word lines WLL0-WLL95 running across the entire block. The structure of FIG. 4F corresponds to portion 401 in Block 2 of FIGS. 4B-4E including bit lines 425. Within the block, each bit line is connected to four NAND strings. Drain side selection lines SGD0, SGD1, SGD2 and SGD3 are used to determine which of the four NAND strings connect to the associated bit line(s). Source side selection lines SGS0, SGS1, SGS2 and SGS3 are used to determine which of the four NAND strings connect to the common source line. The block can also be thought of as divided into four sub-blocks SB0, SB1, SB2 and SB3. Sub-block SB0 corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3.

Each bit line 425 is connected to sense amplifiers in the peripheral circuitry of the storage medium 104 (e.g., in sense blocks 370 of the read/write circuits 360). The sense amplifiers sense voltage signals associated with selected memory cells of the respective NAND strings corresponding to each bit line (e.g., determining whether a given memory cell is conducting current during a sense operation, or how much current the given memory cell conducts during the sense operation). The sense amplifiers then amplify the sensed voltages to levels that are optimized for the I/O circuitry of the storage medium 104, interface channel 114, and storage controller 102.

Memory cells in the various implementations of the memory array 350 described above can be erased, programmed, and read. At the end of a successful programming process (with verification), the threshold voltages of the memory cells should be within one or more distributions (ranges) of threshold voltages for programmed memory cells or within a distribution (range) of threshold voltages for erased memory cells, as appropriate.

Figure 5:
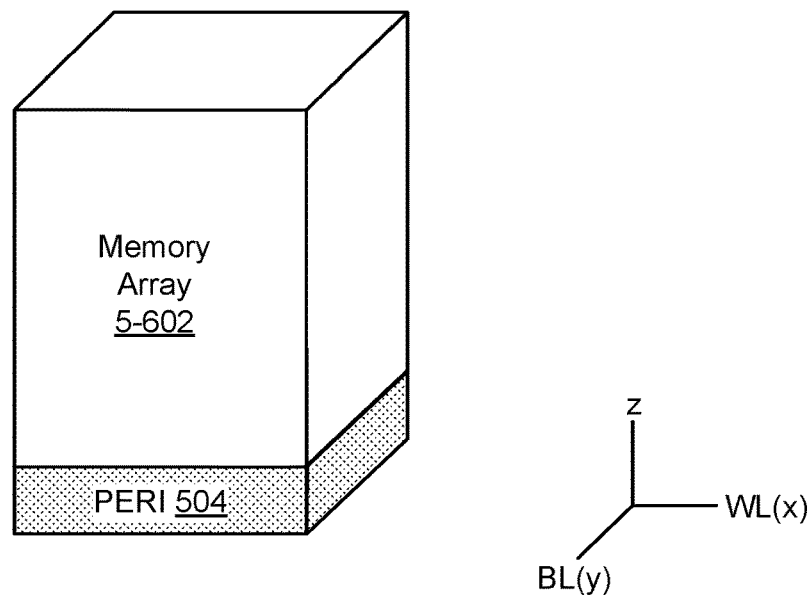
FIG. 5 is a perspective view of a CMOS under array (CuA) memory structure 500 in accordance with some implementations.

FIG. 5 is a perspective view of a CMOS under array (CuA) memory structure 500 in accordance with some implementations. CuA structure 500 includes a memory array 502 and peripheral circuitry 504.

Memory array 502 corresponds to the three-dimensional memory array 350 described above with reference to FIGS. 3 and 4A-4F. In one example implementation, the length of the plane in the x-direction represents a direction in which signal paths for word lines extend (a word line or SGD line direction), and the width of the plane in the y-direction, represents a direction in which signal paths for bit lines extend (a bit line direction). The z-direction represents a height of the storage device.

Peripheral circuitry 504 corresponds to any one or any combination of control circuitry 310, state machine 312, decoders 314/324/326, power control module 316, temperature detection circuit 318, buffers 320, sense blocks 370, read/write circuits 360, and storage controller 102 described above with reference to FIGS. 1-4F. For example, peripheral circuitry 504 may include voltage regulators, charge pumps, page buffers, sense amplifiers, logic circuits, redundancy structures, level shifters, and so forth.

In some implementations, peripheral circuitry 504 is implemented underneath the vertical stack of memory cells in memory array 502. Implementing the peripheral circuitry 502 underneath the memory 502 saves die space (allowing more die space to be used for memory cells) and increases the amount of space available for peripheral circuitry.

In some implementations, the storage controller 102 and storage medium 104 of the storage system 100 are implemented as separate packages on a printed circuit board (PCB), and channel 114 interfaces with physical contacts (sometimes referred to as input/output (IO) pads) integrated into and/or affixed to one or more edges of each package.

The CuA structure 500 may include such pads in the peripheral circuitry 504 at locations adjacent to the edge of the package containing the storage medium 104. As described in more detail below, such pads may interfere with the functionality of various components of the memory array 502 (corresponding to array 350), depending on the proximity of the memory array components to the pads.

As described above with reference to FIGS. 4A-4F, memory array 350 includes a source line layer SL below the alternating dielectric layers and word line layers and the vertical columns. Source side selection lines are used to determine which of the strings of memory cells connects to the common source line. Since the source line SL is disposed underneath the vertical stack of layers of the memory array 350, the source line is sometimes referred to as a buried source line (BSL). The source line may additionally or alternatively be referred to as the cell source (CELSRC) due to its function as a common source line for the memory cells of the memory array 350.

During program (write), sense (read), and erase operations, the threshold voltages of memory cells are adjusted or sensed based on the amount of charge in areas of the charge trapping layer 473 associated with respective memory cells, which affects the amount of current flowing between respective bit lines 425 and the common source line SL. To execute such operations, the bit lines, word lines, and source line are biased to voltage levels depending on the operation and whether a given cell is selected to be affected by that operation.

Figure 6:
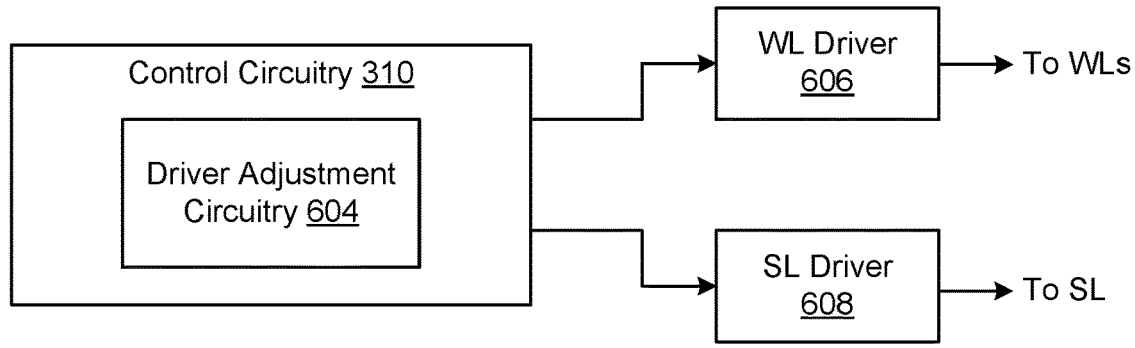
FIG. 6 is a block diagram of word line and source line driver circuitry 600 in accordance with some implementations.

FIG. 6 is a block diagram of word line and source line driver circuitry 600 in accordance with some implementations. Control circuitry 310 (FIG. 3) includes driver adjustment circuitry 604, which is configured to set word line WL and source line SL voltage levels for program, erase, and read operations for cells of the memory array 350.

The driver adjustment circuitry 604 is configured to convey signals to a word line WL driver 606, communicating the steady state word line voltages that are necessary for performing various operations on various cells of the memory array 350. The WL driver 606 drives steady state voltages to the word lines connected to the driver 606 in accordance with the signals.

The driver adjustment circuitry 604 is configured to convey signals to a source line SL driver 608, communicating the steady state word line voltages that are necessary for performing various operations on various cells of the memory array 350. The SL driver 608 drives steady state voltages to the common source line SL (see FIGS. 4A-4F) in accordance with the signals.

The location of the source line layer, disposed underneath the memory array 350 (see, e.g., SL in FIG. 4A), makes the source line voltage levels susceptible to increased variation caused by various components of the peripheral circuitry (504, FIG. 5). For example, for blocks in planes of memory cells (e.g., block 0 in plane P0, see FIG. 4B) that are relatively close to pads in the peripheral circuitry, the source line voltage may behave differently (have increased variation) compared to the source line voltage for blocks that are farther away from the pads in the peripheral circuitry (e.g., block 2 in plane P1, see FIG. 4B). These changes in source line voltage variations are due to the metal routing connections of the SL driver being close to the CNA boundaries associated with the IO pads.

For planes that are not proximate to the IO pads in the peripheral circuitry (e.g., for a top plane), the source line voltage values for blocks in such planes exhibit relatively minimum variation (e.g., within a minimum step size for source line voltage values). Conversely, for planes that are proximate to the IO pads in the peripheral circuitry (e.g., for a bottom plane), the source line voltage values for blocks in such planes that are closest to the peripheral circuitry (e.g., a bottom block in the bottom plane) may be subject to more variation than the source line voltage values for blocks in such planes that are not closest to the IO pads in the peripheral circuitry (e.g., a top block in the bottom plane).

For example, if a memory array 350 includes four planes P0-P3 (see, e.g., FIG. 4B), and the IO pads in the peripheral circuitry are disposed underneath the memory array 350 (as described above with reference to FIG. 5), the bottom two planes P0 and P1 would be closer to IO pads in the peripheral circuitry than the top two planes P2 and P3.

The source line voltage for blocks in the top two planes (P2 and P3) would therefore exhibit minimal variation, while the source line voltage for blocks in the bottom two planes (P0 and P1), or just the bottom plane (P0) may exhibit increased variation.

Figures 7, 8:
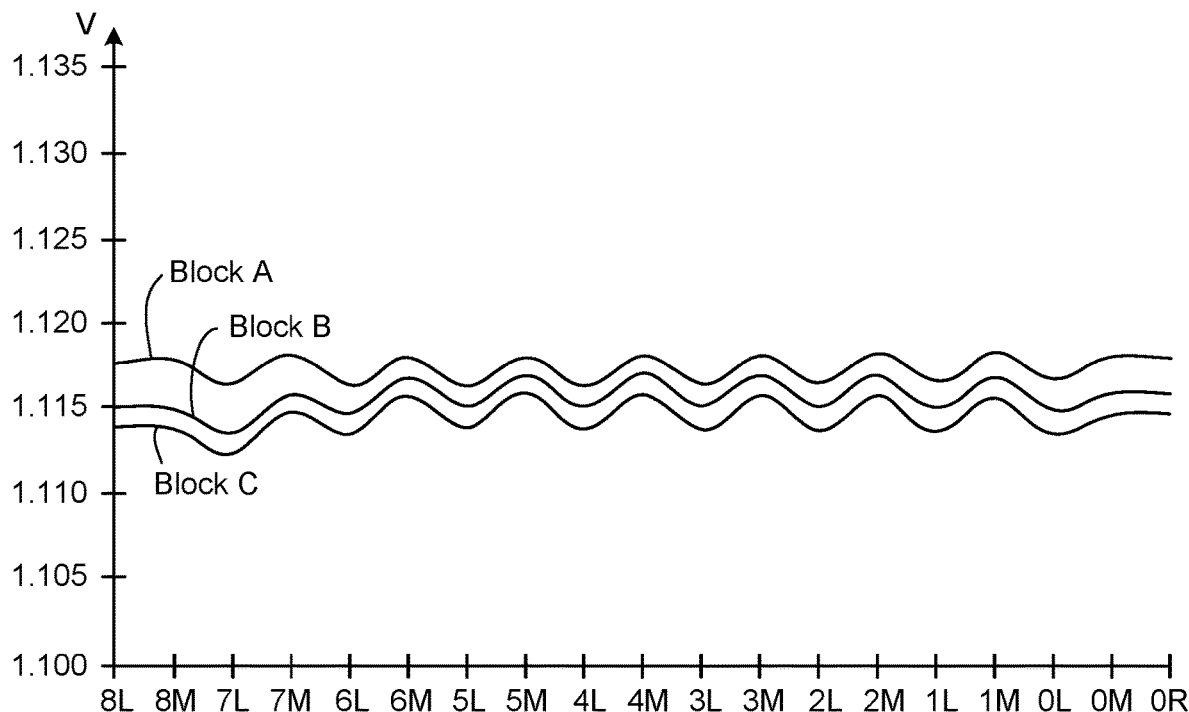
FIG. 7 illustrates variations in source line voltage levels for different blocks in a plane that is not proximate to IO pads in the peripheral circuitry (e.g., a top plane) in accordance with some implementations.
FIG. 8 is a table including example bounce and gradient values of the source line voltage levels depicted in FIG. 7 in accordance with some implementations.

FIG. 7 illustrates variations in source line voltage levels for different blocks in a plane that is not proximate to IO pads in the peripheral circuitry (e.g., a top plane) in accordance with some implementations. The horizontal axis represents different subsets of memory cells (sometimes referred to as tiles) across the blocks of a plane, and the vertical axis represents voltage levels of the source line for that plane.

The three blocks in the graph represent blocks at different locations within the plane. Referring to FIG. 4B as a reference, Block A in the graph of FIG. 7 may corresponding to block 0 in plane P3 (sometimes referred to as a bottom block, or a block at the bottom of the plane), Block B in the graph may corresponding to block M/2 in plane P3 (sometimes referred to as a middle block, or a block in the middle of the plane), and Block C in the graph may corresponding to block M−1 in plane P3 (sometimes referred to as a top block, or a block at the top of the plane).

As shown in the graph, the source line voltages for all three blocks exhibit similar variations in bounce (maximum voltage) and gradient (difference between minimum and maximum voltage) across the tiles of each block.

FIG. 8 is a table including example bounce and gradient values of the source line voltage levels depicted in FIG. 7 in accordance with some implementations. Assuming a minimum source line voltage step size (the minimum amount the SL driver is capable of adjusting the source line voltage) of 12.5 mV, the differences in source line voltage level bounce for each block are less than the minimum step size. As such, the variations in source line voltage levels across the different block locations of a plane not proximate to IO pads in the peripheral circuitry are acceptable.

Figure 9:
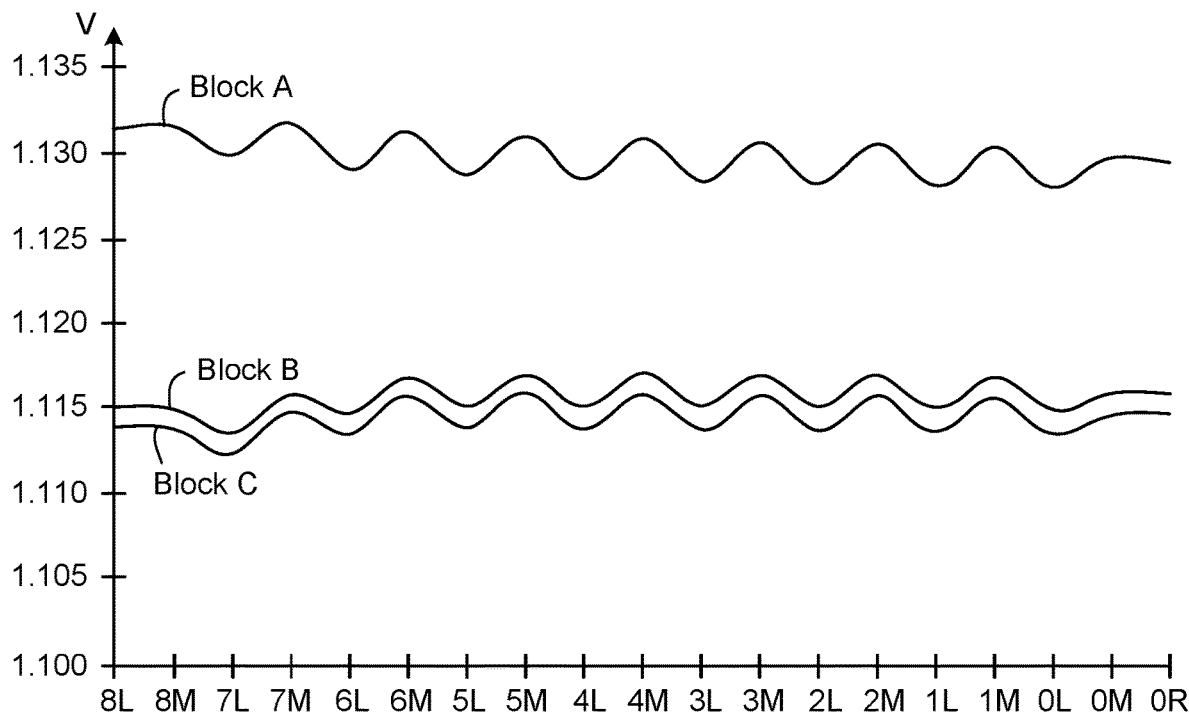
FIG. 9 illustrates variations in source line voltage levels for different blocks in a plane that is proximate to IO pads in the peripheral circuitry (e.g., a bottom plane) in accordance with some implementations.

FIG. 9 illustrates variations in source line voltage levels for different blocks in a plane that is proximate to IO pads in the peripheral circuitry (e.g., a bottom plane) in accordance with some implementations. The horizontal axis represents different subsets of memory cells (sometimes referred to as tiles) across the blocks of a plane, and the vertical axis represents voltage levels of the source line for that plane.

The three blocks in the graph represent blocks at different locations within the plane. Referring to FIG. 4B as a reference, Block A in the graph of FIG. 9 may corresponding to block 0 in plane P0 (sometimes referred to as a bottom block, or a block at the bottom of the plane), Block B in the graph may corresponding to block M/2 in plane P0 (sometimes referred to as a middle block, or a block in the middle of the plane), and Block C in the graph may corresponding to block M−1 in plane P0 (sometimes referred to as a top block, or a block at the top of the plane).

As shown in the graph, the source line voltages for Blocks B and C exhibit similar variations in bounce (maximum voltage) and gradient (difference between minimum and maximum voltage) across the tiles of each block. However, the source line voltage for Block A (e.g., the bottom block of the bottom plane) is much higher due to the proximity of Block A to the IO pads in the peripheral circuitry.

Since the bottom plane is closer to the IO pads, ground supply voltage VSS is slightly lower and current is slightly higher, which causes the source line bounce to be higher. Further, bottom plane layout limitations in regions proximate to the IO pads cause source line noise to be worse. As such, the source line voltage for blocks/planes that are proximate to the IO pads is relatively high, as depicted in FIG. 9.

Figure 10:
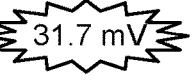
FIG. 10 is a table including example bounce and gradient values of the source line voltage levels depicted in FIG. 9 in accordance with some implementations.

FIG. 10 is a table including example bounce and gradient values of the source line voltage levels depicted in FIG. 9 in accordance with some implementations. Assuming a minimum source line voltage step size (the minimum amount the SL driver is capable of adjusting the source line voltage) of 12.5 mV, the difference in source line voltage level bounce for Blocks B and C is less than the minimum step size.

However, the difference in source line voltage level bounce between Block A and Block C (e.g., the top and bottom blocks) is higher than the minimum step size (31.7−15.9=15.8 mV, which is greater than the minimum step size of 12.5 mV). As such, the variations in source line voltage levels across the different block locations of a plane proximate to IO pads in the peripheral circuitry are not acceptable.

The bounce and gradient levels depicted in FIG. 7-10 are illustrative and are not meant to be limiting. In addition, the terms "top block," "middle block," and "bottom block," as well as the terms "top plane" and "bottom plane" are interchangeable in that they depend merely on the placement of the peripheral circuitry compared to the location of the planes/blocks.

For example, if the peripheral circuitry is disposed below the memory array 350, then a block/plane that is closest to IO pads in the peripheral circuitry may be referred to as a bottom block in a bottom plane, and a plane that is farther from the peripheral circuitry may be referred to as a top plane. However, if the peripheral circuitry is disposed adjacent to the memory array 350, then a block/plane that is closest to IO pads in the peripheral circuitry and a block/plane that is farther from IO pads in the peripheral circuitry may be referred to with different terms (e.g., a right block/plane, a left block/plane, and so forth).

Moreover, the term "proximate" as used herein describes planes and blocks that are close enough to IO pads in the peripheral circuitry for the IO pads to cause the source line voltage bounce to increase for the blocks in those planes. Another way to describe whether a plane or block is proximate to IO pads in the peripheral circuitry is to refer to the position of the plane or block with respect to the IO pads in the peripheral circuitry. A plane or block having a position of under a threshold distance from the IO pads may be referred to as being proximate to the IO pads.

The bounce and gradient values depicted in FIGS. 7-10 are for illustrative purposes; exact bounce and gradient values will depend on the specific architecture of the memory array 350.

To address the increased bounce in source line voltage across blocks and planes that are proximate to IO pads in peripheral circuitry (in other words, to minimize the source line bounce variation impact), the driver adjustment circuitry 604 may be configured to (i) cause the WL driver 606 to increase the word line voltage levels for word lines of the blocks that are proximate to the IO pads, and/or (ii) cause the SL driver 608 to decrease the source line level for blocks that are proximate to the IO pads.

Figure 11:
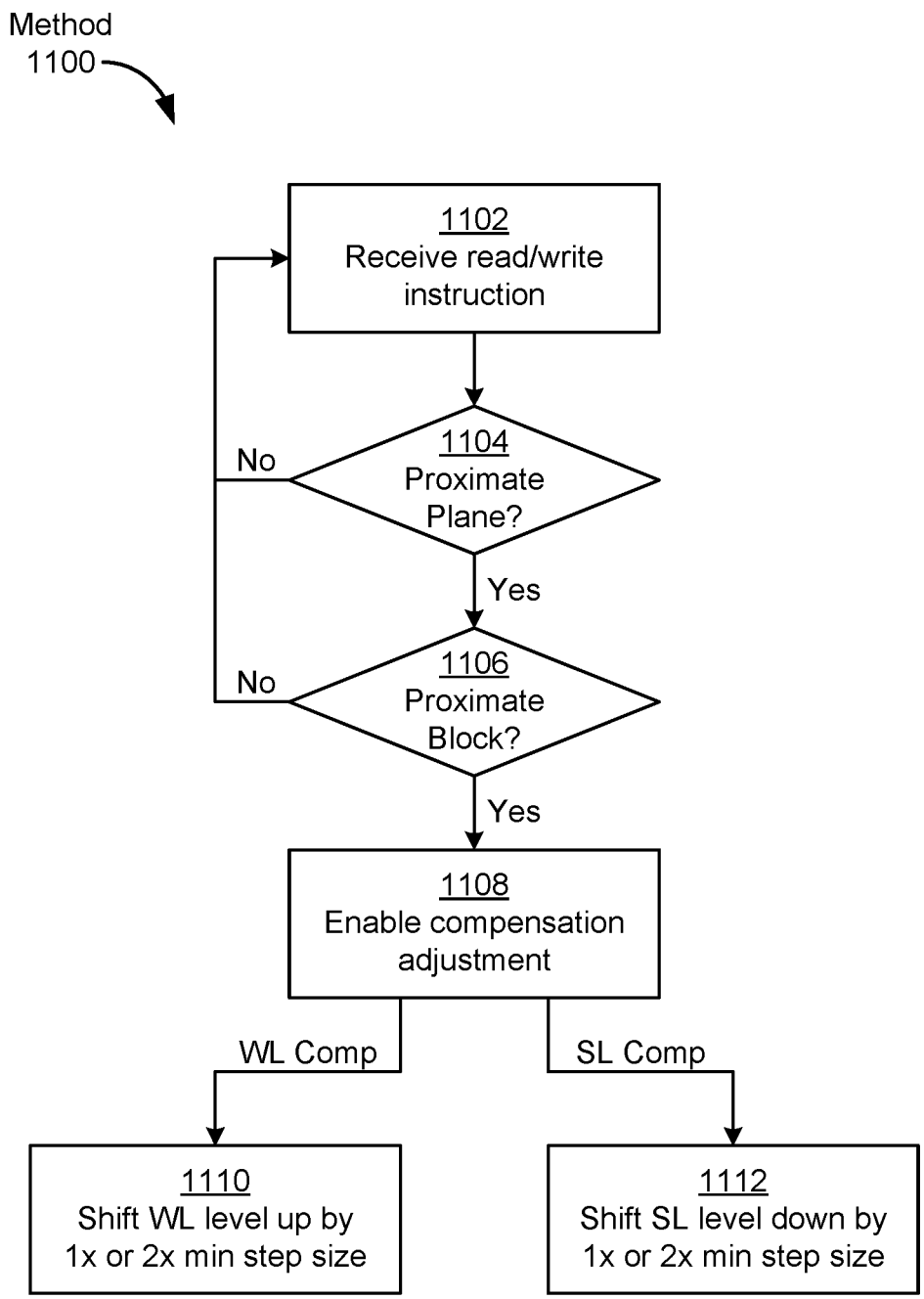
FIG. 11 is a flow diagram of a method 1100 of compensating for bounce variation in blocks and planes that are proximate to IO pads of the storage medium 104 in accordance with some implementations.

FIG. 11 is a flow diagram of a method 1100 of compensating for bounce variation in blocks and planes that are proximate to IO pads of the storage medium 104 in accordance with some implementations. Method 1100 may be executed by driver circuitry 600 (FIG. 6), including control circuitry 310 (FIG. 3), driver adjustment circuitry 604, WL driver 606, and/or SL driver 608.

Upon receiving (1102) a write or read instruction associated with a plane and/or block of memory cells, the control circuitry 310 determines (1104) whether the plane is proximate to IO pads of the peripheral circuitry. For example, the control circuitry 310 may determine whether the plane associated with the write or read instruction is a bottom plane. If not, the method starts over. If so, the method proceeds. Such a determination may be hardwired (e.g., using state machine 312, FIG. 3), since it depends on physical features of the configuration of the storage medium 104, and these features (e.g., proximity of IO pads to a particular plane) do not change.

The control circuitry 310 determines (1106) whether the block is proximate to IO pads of the peripheral circuitry. For example, the control circuitry 310 may determine whether the block is a bottom block (of the bottom plane). If not, the method starts over. If so, the method proceeds. Such a determination may be hardwired (e.g., using state machine 312, FIG. 3), since it depends on physical features of the configuration of the storage medium 104, and these features (e.g., proximity of IO pads to a particular block) do not change.

Upon determining that the block/plane associated with the write or read operation are proximate to an IO pad of the peripheral circuitry, the control circuitry 310 enables (1108) one or more compensation adjustments for the block. If a word line WL compensation adjustment is enabled, the method proceeds with operation 1110. If a source line SL compensation adjustment is enabled, the method proceeds with operation 1112. In some implementations, both compensation adjustments may be enabled. In such implementations, either adjustment may be performed first.

Upon proceeding with WL compensation (1110), the driver adjustment circuitry 604 increases word line voltage levels (via WL driver 606) of memory cells in the block/plane associated with the write/read operation. The driver adjustment circuitry 604 may perform this adjustment by shifting the WL levels up in increments of the minimum step unit of the WL driver 606. For example, if the minimum step unit is 12.5 mV, the WL levels may be shifted up by 12.5 mV or by 25 mV.

The amount of shifting depends on how much the source line voltage bounce needs to be compensated, which is based on the difference in bounce between the block proximate to the IO pads vs. the blocks not proximate to the IO pads. For example, if the difference in source line voltage bounce between top and bottom blocks of the bottom plane is 15.8 mV, the WL may be shifted up by 12.5 mV.

In some implementations, the driver adjustment circuitry is configured to cause the word line driver to adjust the word line voltage level by sending (i) an adjustment enable signal to the word line driver and (ii) an adjustment amount signal to the word line driver specifying an amount to increase the word line voltage level (e.g., by 1× or 2× the minimum step size).

Upon proceeding with SL compensation (1112), the driver adjustment circuitry 604 decreases source line voltage levels (via SL driver 608) of memory cells in the block/plane associated with the write/read operation. The driver adjustment circuitry 604 may perform this adjustment by shifting the SL levels down in increments of the minimum step unit of the SL driver 608. For example, if the minimum step unit is 12.5 mV, the SL levels may be shifted down by 12.5 mV or by 25 mV.

The amount of shifting depends on how much the source line voltage bounce needs to be compensated, which is based on the difference in bounce between the block proximate to the IO pads vs. the blocks not proximate to the IO pads. For example, if the difference in source line voltage bounce between top and bottom blocks of the bottom plane is 15.8 mV, the SL may be shifted down by 12.5 mV.

In some implementations, the driver adjustment circuitry is configured to cause the source line driver to adjust the source line voltage level by sending (i) an adjustment enable signal to the source line driver and (ii) an adjustment amount signal to the source line driver specifying an amount to decrease the source line voltage level (e.g., by 1× or 2× the minimum step size).

Figures 12, 13:
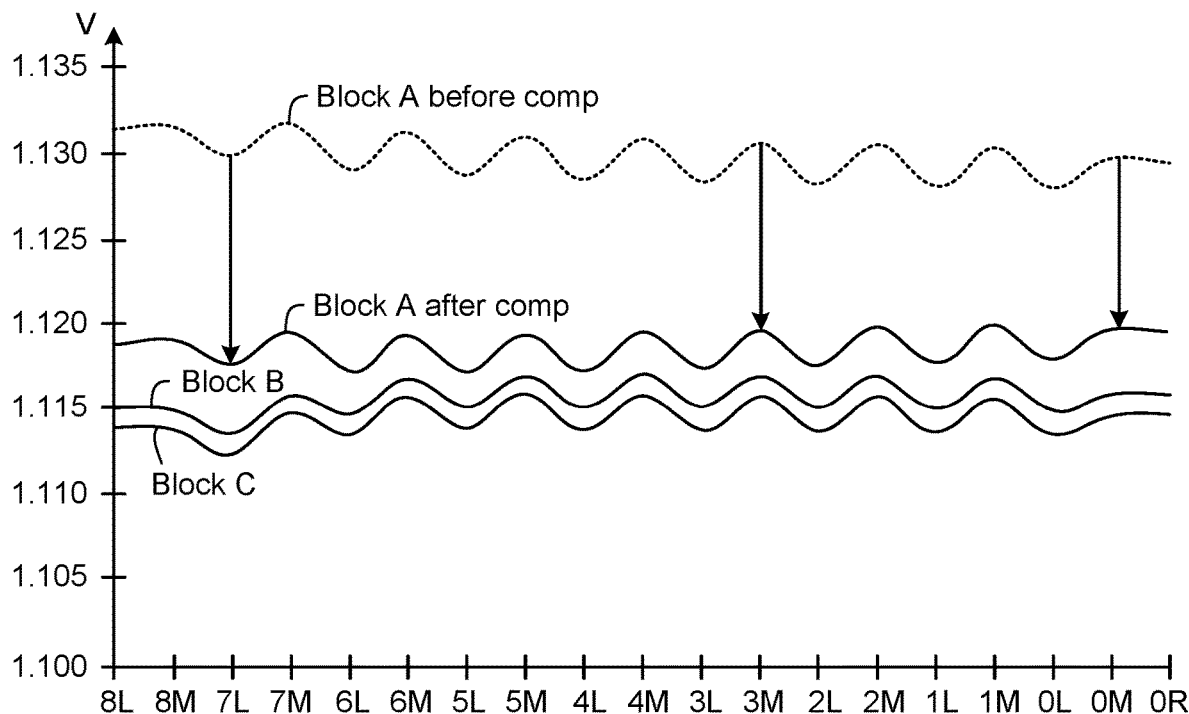
FIG. 12 illustrates variations in source line voltage levels for different blocks in a plane that is proximate to IO pads in the peripheral circuitry (e.g., a bottom plane) after compensation adjustments in accordance with some implementations.
FIG. 13 is a table including example bounce and gradient values of the source line voltage levels depicted in FIG. 12 in accordance with some implementations.

FIG. 12 illustrates variations in source line voltage levels for different blocks in a plane that is proximate to IO pads in the peripheral circuitry (e.g., a bottom plane) after compensation adjustments in accordance with some implementations.

The graph in FIG. 12 corresponds to the graph in FIG. 9, but after having compensated for the increased source line voltage bounce in operations 1110 and/or 1112 (FIG. 11), the source line voltage bounce for Block A is now much closer to that of the other blocks in the plane.

FIG. 13 is a table including example bounce and gradient values of the source line voltage levels depicted in FIG. 12 in accordance with some implementations. Assuming a minimum source line voltage step size (the minimum amount the SL driver is capable of adjusting the source line voltage) of 12.5 mV, the difference in source line voltage level bounce for Blocks A and C is now less than the minimum step size, as a result of the compensation adjustment operations described above.

It will be appreciated by those skilled in the art that changes could be made to the exemplary embodiments shown and described above without departing from the broad inventive concept thereof. It is understood, therefore, that this invention is not limited to the exemplary embodiments shown and described, but it is intended to cover modifications within the spirit and scope of the present invention as defined by the claims. For example, specific features of the exemplary embodiments may or may not be part of the claimed invention, different components as opposed to those specifically mentioned may perform at least some of the features described herein, and features of the disclosed embodiments may be combined. As used herein, the terms "about" and "approximately" may refer to + or − 10% of the value referenced. For example, "about 9" is understood to encompass 8.2 and 9.9.

It is to be understood that at least some of the figures and descriptions of the invention have been simplified to focus on elements that are relevant for a clear understanding of the invention, while eliminating, for purposes of clarity, other elements that those of ordinary skill in the art will appreciate may also comprise a portion of the invention. However, because such elements are well known in the art, and because they do not necessarily facilitate a better understanding of the invention, a description of such elements is not provided herein.

It will be understood that, although the terms "first," "second," etc. are sometimes used herein to describe various elements, these elements should not be limited by these terms. These terms are only used to distinguish one element from another. For example, a first element could be termed a second element, and, similarly, a second element could be termed a first element, without changing the meaning of the description, so long as all occurrences of the "first element" are renamed consistently and all occurrences of the second element are renamed consistently. The first element and the second element are both elements, but they are not the same element.

As used herein, the term "if" may be, optionally, construed to mean "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

The terminology used herein is for the purpose of describing particular implementations only and is not intended to be limiting of the claims. As used in the description of the implementations and the appended claims, the singular forms "a", "an" and "the" are intended to include the plural forms as well, unless the context clearly indicates otherwise.

It will also be understood that the term "and/or" as used herein refers to and encompasses any and all possible combinations of one or more of the associated listed items. It will be further understood that the terms "comprises" and/or "comprising," when used in this specification, specify the presence of stated features, integers, operations, elements, and/or components, but do not preclude the presence or addition of one or more other features, integers, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined (that a stated condition precedent is true)" or "if (a stated condition precedent is true)" or "when (a stated condition precedent is true)" may be construed to mean "upon determining" or "in response to determining" or "in accordance with a determination" or "upon detecting" or "in response to detecting" that the stated condition precedent is true, depending on the context.

Further, to the extent that the method does not rely on the particular order of steps set forth herein, the particular order of the steps should not be construed as limitation on the claims. The claims directed to the method of the present invention should not be limited to the performance of their steps in the order written, and one skilled in the art can readily appreciate that the steps may be varied and still remain within the spirit and scope of the present invention.

What is claimed is:

1. A data storage system, comprising:
   a storage controller coupled to a storage medium via an electrical interface, wherein the electrical interface is connected to a plurality of input/output (IO) pads of the storage medium;
   a plurality of planes of the storage medium, wherein each of the plurality of planes includes a plurality of blocks of memory cells;
   control circuitry of the storage medium configured to receive a read or write instruction from the storage controller via the IO pads and associate the read or write instruction with memory cells of a first block of a first plane of the plurality of planes; and
   driver adjustment circuitry of the storage medium configured to adjust:
      a word line voltage level via a word line driver for the first block of the first plane based on (i) a position of the first plane with respect to the IO pads of the storage medium and (ii) a position of the first block within the first plane, or
      a source line voltage level via a source line driver for the first block of the first plane based on (i) a position of the first plane with respect to the IO pads of the storage medium and (ii) a position of the first block within the first plane.

2. The data storage system of claim 1, wherein:
the driver adjustment circuitry is configured to adjust the word line voltage level for the first block of the first plane; and
adjusting the word line voltage level for the first block of the first plane includes increasing the word line voltage level by a minimum step increment associated with the word line driver.

3. The data storage system of claim 1, wherein:
the driver adjustment circuitry is configured to adjust the source line voltage level for the first block of the first plane; and
adjusting the source line voltage level for the first block of the first plane includes decreasing the word line voltage level by a minimum step increment associated with the source line driver.

4. The data storage system of claim 1, wherein:
the IO pads of the storage medium are located in peripheral circuitry disposed in a CMOS under array (CuA) arrangement;
the first plane is located closer to the IO pads in the peripheral circuitry than a second plane;
the first block of the first plane is located closer to the IO pads in the peripheral circuitry than a second block in the first plane; and
the driver adjustment circuitry is further configured to forgo adjusting word line voltage levels associated with read and write operations or source line voltage levels associated with read and write operations for (i) the second block of the first plane and (ii) for all blocks of the second plane.

5. The data storage system of claim 4, wherein:
the first plane is a bottom plane;
the second plane is a middle or top plane;
the first block of the first plane is a bottom block; and
the second block of the first plane is a middle or top block.

6. The data storage system of claim 1, wherein the driver adjustment circuitry is configured to cause the word line driver to adjust the word line voltage level by sending (i) an adjustment enable signal to the word line driver and (ii) an adjustment amount signal to the word line driver specifying an amount to increase the word line voltage level.

7. The data storage system of claim 1, wherein the driver adjustment circuitry is configured to cause the source line driver to adjust the source line voltage level by sending (i) an adjustment enable signal to the source line driver and (ii) an adjustment amount signal to the source line driver specifying an amount to decrease the source line voltage level.

8. A method of operating a data storage system, comprising:
at a storage medium coupled to a storage controller via an electrical interface, wherein the electrical interface is connected to a plurality of input/output (IO) pads of the storage medium:
receiving a read or write instruction from the storage controller via the IO pads and associating the read or write instruction with memory cells of a first block of a first plane of a plurality of planes of the storage medium;
adjusting a word line voltage level via a word line driver or a source line voltage level via a source line driver for the first block of the first plane based on (i) a position of the first plane with respect to the IO pads of the storage medium and (ii) a position of the first block within the first plane; and
performing a read or write operation on the memory cells of the first block of the first plane in accordance with the read or write instruction using the adjusted word line voltage level or the adjusted source line voltage level.

9. The method of claim 8, wherein:
adjusting the word line voltage level or the source line voltage level includes adjusting the word line voltage level; and
adjusting the word line voltage level for the first block of the first plane includes increasing the word line voltage level by a minimum step increment associated with the word line driver.

10. The method of claim 8, wherein:
adjusting the word line voltage level or the source line voltage level includes adjusting the source line voltage level; and
adjusting the source line voltage level for the first block of the first plane includes decreasing the word line voltage level by a minimum step increment associated with the source line driver.

11. The method of claim 8, wherein:
the IO pads of the storage medium are located in peripheral circuitry disposed in a CMOS under array (CuA) arrangement;
the first plane is located closer to the IO pads in the peripheral circuitry than a second plane;
the first block of the first plane is located closer to the IO pads in the peripheral circuitry than a second block in the first plane; and
the method further comprises forgoing adjusting word line voltage levels associated with read and write operations or source line voltage levels associated with read and write operations for (i) the second block of the first plane and (ii) for all blocks of the second plane.

12. The method of claim 8, wherein adjusting the word line voltage level includes sending (i) an adjustment enable signal to the word line driver and (ii) an adjustment amount signal to the word line driver specifying an amount to increase the word line voltage level.

13. The method of claim 8, wherein adjusting the source line voltage level includes sending (i) an adjustment enable signal to the source line driver and (ii) an adjustment amount signal to the source line driver specifying an amount to decrease the source line voltage level.

14. A data storage system, comprising:
at a storage medium coupled to a storage controller via an electrical interface, wherein the electrical interface is connected to a plurality of input/output (IO) pads of the storage medium:
means for receiving a read or write instruction from the storage controller via the IO pads and associating the read or write instruction with memory cells of a first block of a first plane of a plurality of planes of the storage medium;
means for adjusting a word line voltage level via a word line driver or a source line voltage level via a source line driver for the first block of the first plane based on (i) a position of the first plane with respect to the IO pads of the storage medium and (ii) a position of the first block within the first plane; and
means for performing a read or write operation on the memory cells of the first block of the first plane in accordance with the read or write instruction using the adjusted word line voltage level or the adjusted source line voltage level.

15. The data storage system of claim 14, wherein:

the means for adjusting the word line voltage level or the source line voltage level include means for adjusting the word line voltage level; and the means for adjusting the word line voltage level for the first block of the first plane include means for increasing the word line voltage level by a minimum step increment associated with the word line driver.

16. The data storage system of claim 14, wherein:

the means for adjusting the word line voltage level or the source line voltage level include means for adjusting the source line voltage level; and the means for adjusting the source line voltage level for the first block of the first plane include means for decreasing the word line voltage level by a minimum step increment associated with the source line driver.

17. The data storage system of claim 14, wherein:

the IO pads of the storage medium are located in peripheral circuitry disposed in a CMOS under array (CuA) arrangement;

the first plane is located closer to the IO pads in the peripheral circuitry than a second plane;

the first block of the first plane is located closer to the IO pads in the peripheral circuitry than a second block in the first plane; and the method further comprises forgoing adjusting word line voltage levels associated with read and write operations or source line voltage levels associated with read and write operations for (i) the second block of the first plane and (ii) for all blocks of the second plane.

18. The data storage system of claim 17, wherein:

the first plane is a bottom plane;

the second plane is a middle or top plane;

the first block of the first plane is a bottom block; and the second block of the first plane is a middle or top block.

19. The data storage system of claim 14, wherein the means for adjusting the word line voltage level include means for sending (i) an adjustment enable signal to the word line driver and (ii) an adjustment amount signal to the word line driver specifying an amount to increase the word line voltage level.

20. The data storage system of claim 14, wherein the means for adjusting the source line voltage level include means for sending (i) an adjustment enable signal to the source line driver and (ii) an adjustment amount signal to the source line driver specifying an amount to decrease the source line voltage level.

* * * * *